United States Patent
Musayev et al.

(10) Patent No.: US 11,601,157 B2
(45) Date of Patent: Mar. 7, 2023

(54) METHOD AND SYSTEM FOR LINEAR SIGNAL PROCESSING WITH SIGNAL DECOMPOSITION

(71) Applicant: HUAWEI TECHNOLOGIES CANADA CO., LTD., Kanata, CA (US)

(72) Inventors: Javid Musayev, Toronto (CA); Antonio Liscidini, Toronto (CA)

(73) Assignee: HUAWEI TECHNOLOGIES CANADA CO., LTD., Kanata (CA)

( * ) Notice: Subject to any disclaimer, the term of this patent is extended or adjusted under 35 U.S.C. 154(b) by 65 days.

(21) Appl. No.: 17/182,818

(22) Filed: Feb. 23, 2021

(65) Prior Publication Data

US 2021/0258040 A1  Aug. 19, 2021

Related U.S. Application Data

(63) Continuation of application No. PCT/CA2019/051185, filed on Aug. 28, 2019.

(Continued)

(51) Int. Cl.
   *H04B 1/403* (2015.01)
   *H03F 3/189* (2006.01)

(52) U.S. Cl.
   CPC .............. *H04B 1/406* (2013.01); *H03F 3/189* (2013.01)

(58) Field of Classification Search
   CPC ........ H03F 3/189; H03F 3/217; H03F 3/2176; H03F 3/2178; H03F 3/34; H03F 3/38; H03F 3/45; H04B 1/406

(Continued)

(56) References Cited

U.S. PATENT DOCUMENTS 6,737,922 B2  5/2004  Pengelly et al.
6,798,828 B1  9/2004  Phanse
(Continued)

FOREIGN PATENT DOCUMENTS

CN  1272247 A  11/2000
CN  1345492 A  4/2002
(Continued)

OTHER PUBLICATIONS

Doherty, W H., "A New High Efficiency Power Amplifier for Modulated Waves", Proceedings of the Institute of Radio Engineers., Sep. 1, 1936, Institute of Radio Engineers, New York, NY., US, vol. 24, No. 9, pp. 1163-1182.

(Continued)

*Primary Examiner* — Young T. Tse

(57) ABSTRACT

There is provided a method and system for linear signal processing with signal decomposition. The system including: a decomposition module to receive an analog input signal and perform signal decomposition, the signal decomposition including slicing the analog input signal into a plurality of slices to produce one or more analog components and one or more digital components, the decomposition module directing each component to a separate signal path; and a processing module to perform one or more linear operations on at least one of the signal paths. In some cases, the signal decomposition includes slicing the analog input signal into the plurality of slices by amplitude. In some cases, the analog components include unsaturated slices of the analog input signal and the digital components include saturated slices of the analog input signal.

20 Claims, 25 Drawing Sheets

Related U.S. Application Data

(60) Provisional application No. 62/724,756, filed on Aug. 30, 2018.

(58) Field of Classification Search
USPC ........ 375/240, 260, 349; 330/250, 295, 310, 330/69, 84, 98, 150; 455/245.2, 251.1, 455/253.1, 253.2
See application file for complete search history.

(56) References Cited

U.S. PATENT DOCUMENTS

| | | | |
|---|---|---|---|
| 2004/0190660 A1 | 9/2004 | Morris et al. | |
| 2007/0084288 A1* | 4/2007 | Thomas | G01N 29/262 73/627 |
| 2011/0227675 A1* | 9/2011 | Lutz | H04L 25/0286 333/28 R |
| 2014/0236500 A1* | 8/2014 | Koch | G06F 17/148 702/39 |
| 2015/0015428 A1* | 1/2015 | Snelgrove | H03M 1/0626 341/155 |
| 2019/0140600 A1* | 5/2019 | Hou | H03F 3/211 |

FOREIGN PATENT DOCUMENTS

| | | |
|---|---|---|
| CN | 1557082 A | 12/2004 |
| CN | 1711700 A | 12/2005 |
| CN | 1918814 A | 2/2007 |
| CN | 101379706 A | 3/2009 |
| CN | 101467445 A | 6/2009 |
| CN | 101697480 A | 4/2010 |
| CN | 102394714 A | 3/2012 |
| CN | 103580703 A | 2/2014 |
| CN | 106059685 A | 10/2016 |
| WO | 2012159653 A1 | 11/2012 |

OTHER PUBLICATIONS

Wang Qiang et al., Design and Implementation of High Performance Digital T/R Module for Phase Array Radar, Radar Science and Technology, vol. 14 No.4, Aug. 2016, with an English Abstract, total 4 pages.

* cited by examiner

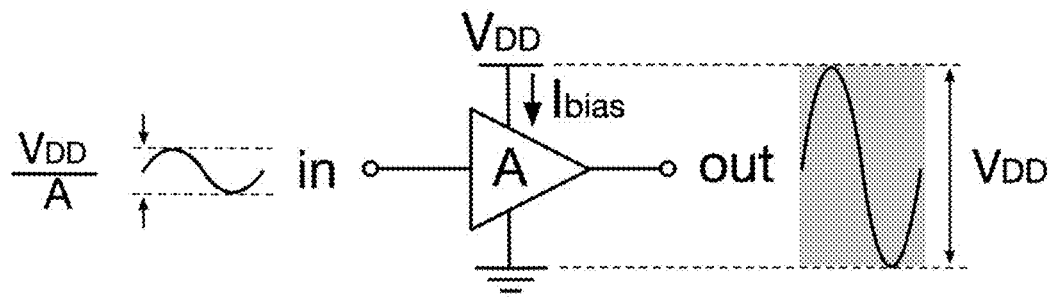
FIG. 3A Single Amplifier
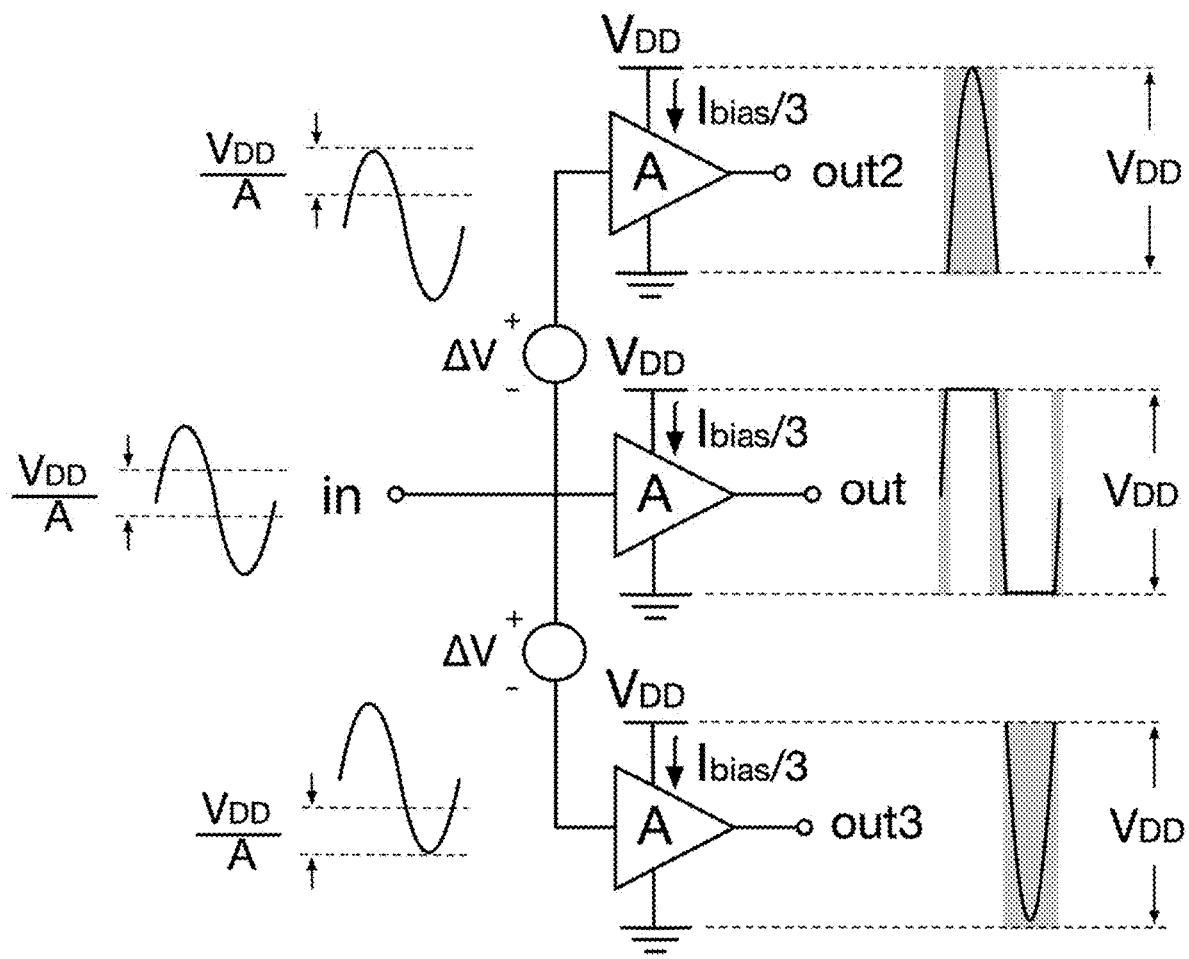
FIG. 3B Quantized Amplifier

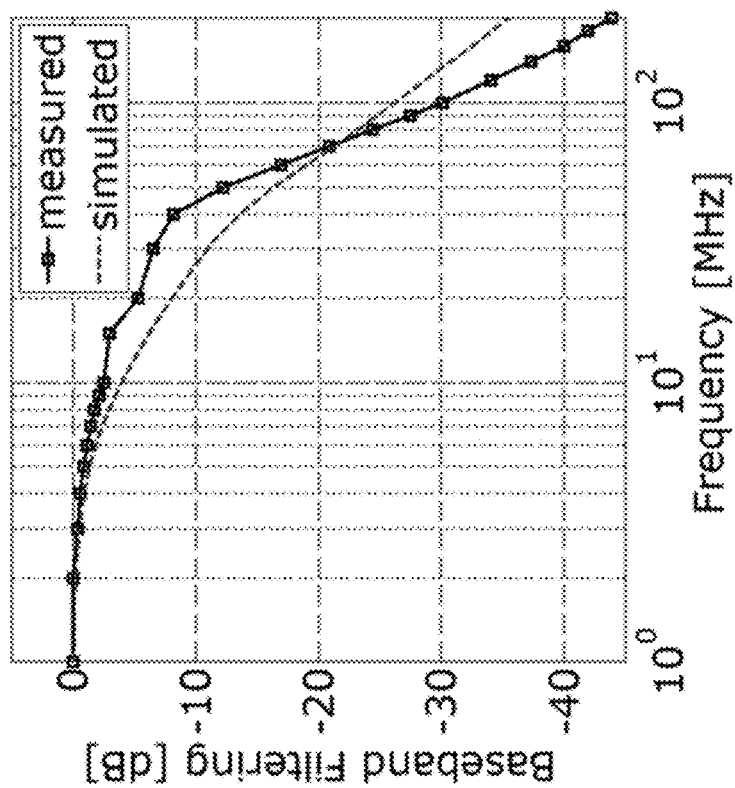
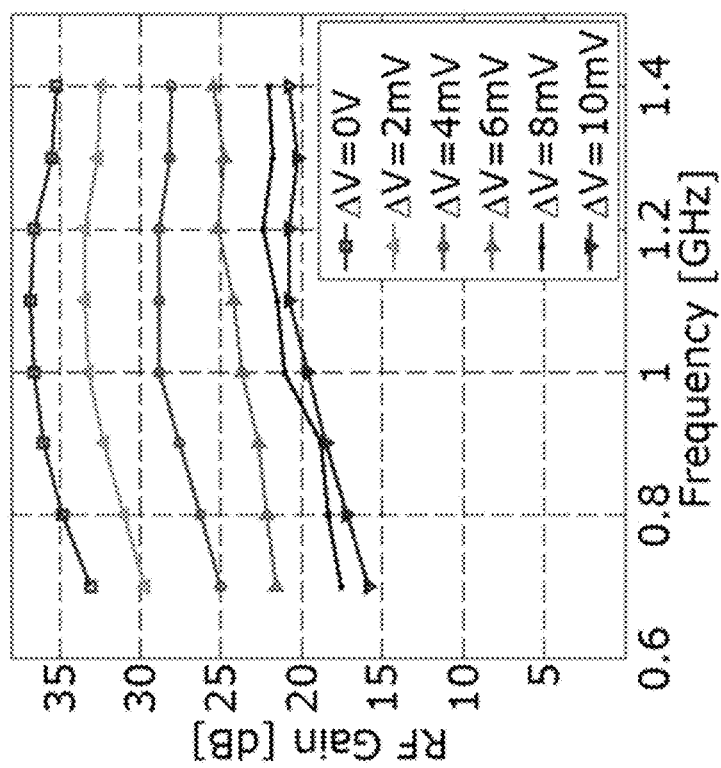
FIG. 13

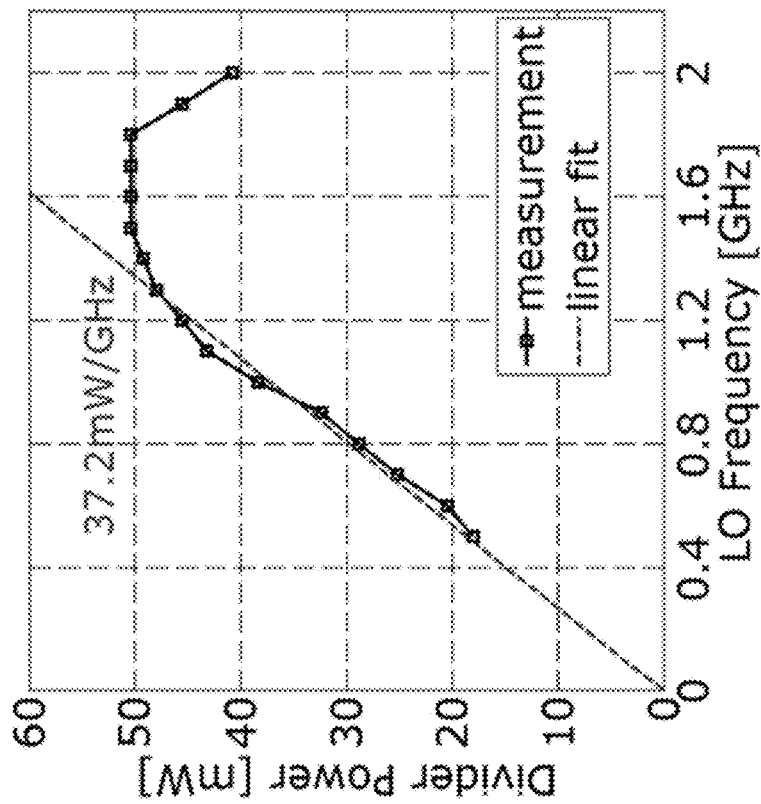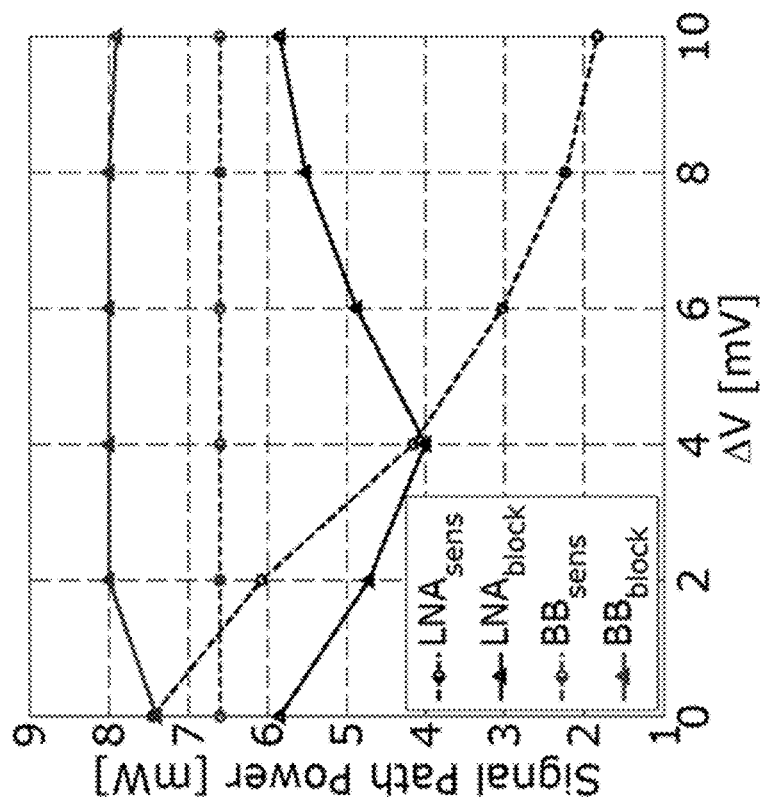
FIG. 16

METHOD AND SYSTEM FOR LINEAR SIGNAL PROCESSING WITH SIGNAL DECOMPOSITION

CROSS REFERENCE TO RELATED APPLICATION

This application is a continuation of International Application No. PCT/CA2019/051185 filed Aug. 28, 2019 entitled "METHOD AND SYSTEM FOR LINEAR SIGNAL PROCESSING WITH SIGNAL DECOMPOSITION" which claims the benefit and priority to U.S. Provisional Patent Application 62/724,756 filed Aug. 30, 2018 entitled "QUANTIZED ANALOG RX FRONT-END FOR SAW-LESS APPLICATIONS" the contents of which are incorporated herein by reference.

TECHNICAL FIELD

The following relates generally to analog signal processing, and more specifically, to a method and system for linear signal processing with signal decomposition.

BACKGROUND

Digital circuits are generally used over analog circuits for signal storing, processing, and noise immunity. This generally makes it tempting to digitize the signal at the earliest stage possible in the signal processing chain. In the case of wireless RF receivers, an example of this idea is a software defined radio (SDR); a wideband analog-to-digital converter (ADC) directly following an antenna. However, stringent blocking requirements with a dynamic range (DR) up to 100 dB and large carrier frequencies on the order of few GHz generally make the ADC power requirements impractical. In some cases, an analog front-end has been used between the antenna and the ADC, which amplifies and down-converts the wanted signal, and filters unwanted blockers. Such front-ends generally have technically challenging linearity and noise requirements as they need to amplify small signals accompanied by large blockers and transfer them to the baseband through down conversion, where filtering is ultimately performed. Generally, filtering in the baseband may not be sufficient to cope with large out-of-band (OOB) blockers. Therefore, expensive and cumbersome external SAW filters would generally have to be used.

SUMMARY

In an aspect, there is provided a system for linear signal processing with signal decomposition, the system including: a decomposition module to receive an analog input signal and perform signal decomposition, the signal decomposition including slicing the analog input signal into a plurality of slices to produce one or more analog components and one or more digital components, the decomposition module directing each of the plurality of slices to one of a plurality of paths; and a processing module to perform one or more linear operations on at least one of the plurality of signal paths.

In a further embodiment, the signal decomposition includes slicing the analog input signal into the plurality of slices by an amplitude of the analog input signal.

In a further embodiment, the analog components include unsaturated slices of the analog input signal and the digital components include saturated slices of the analog input signal, the unsaturated slices and the saturated slices determined by a value of the analog input signal.

In a further embodiment, adjacent unsaturated slices overlap with each other.

In a further embodiment, the digital components are either saturated to a minimum analog value corresponding to a digital value of 0 or are saturated to a maximum analog value corresponding to a digital value of 1, and wherein the analog components can take a value between the minimum analog value and the maximum analog value.

In a further embodiment includes an output module to output the signal of one or more of the plurality of signal paths.

A further embodiment includes a combination module to combine the plurality of signal paths, and an output module to output the combined signal. The combination can occur in analog domain or in digital domain.

In a further embodiment, combining the plurality of signal paths includes summing the plurality of signal paths.

In a further embodiment, the one or more linear operations each includes one of amplification, mixing, filtering, convolution, frequency translation, and optical driving.

In a further embodiment, the decomposition module performs signal decomposition by applying a dc offset on each of the plurality of signal paths, and the one or more linear operations performed by the processing module includes amplification after each of the dc offsets.

In another aspect, there is provided a method for linear signal processing with signal decomposition, the method comprising: receiving an analog input signal; performing signal decomposition by slicing the analog input signal into a plurality of slices to produce one or more analog components and one or more digital components, directing each component to one of a plurality of signal paths; and performing one or more linear operations on the plurality of signal paths.

In a further embodiment, the signal decomposition includes slicing the analog input signal into the plurality of slices by an amplitude of the analog input signal.

In a further embodiment, the analog components include unsaturated slices of the analog input signal and the digital components include saturated slices of the analog input signal.

In a further embodiment, adjacent unsaturated slices overlap with each other.

In a further embodiment, the digital components are either saturated to a minimum analog value corresponding to a digital value of 0 or saturated to a maximum analog value corresponding to a digital value of 1, and wherein the analog components can take a value between the minimum analog value and the maximum analog value.

A further embodiment includes outputting a signal of one of the plurality of signal paths.

A further embodiment includes combining the plurality of signal paths, and outputting the combined signal.

In a further embodiment, the plurality of signal paths include summing the plurality of signal paths.

In a further embodiment, the one or more linear operations each includes one of amplification, mixing, filtering, convolution, frequency translation, and optical driving.

In a further embodiment, performing signal decomposition includes applying a dc offset on each of the plurality of signal paths, and performing the one or more linear operations comprises performing amplification after each of the dc offsets.

These and other embodiments are contemplated and described herein. It will be appreciated that the foregoing summary sets out representative aspects of systems and methods to assist skilled readers in understanding the following detailed description.

BRIEF DESCRIPTION OF THE DRAWINGS

The features of the invention will become more apparent in the following detailed description in which reference is made to the appended drawings wherein:

FIG. 3A is a diagram of an example of a typical single amplifier;

FIG. 3B is an example of a quantized amplifier in accordance with the system of FIG. 1;

FIG. 13 shows measured radio frequency (RF) gain of a front-end at different offsets for the example experiments;

FIG. 16 shows power consumption of the signal path (LNA and Baseband) for different offsets, and the clock path (divider) across RF frequencies, for the example experiments:

DETAILED DESCRIPTION

Figure 1:
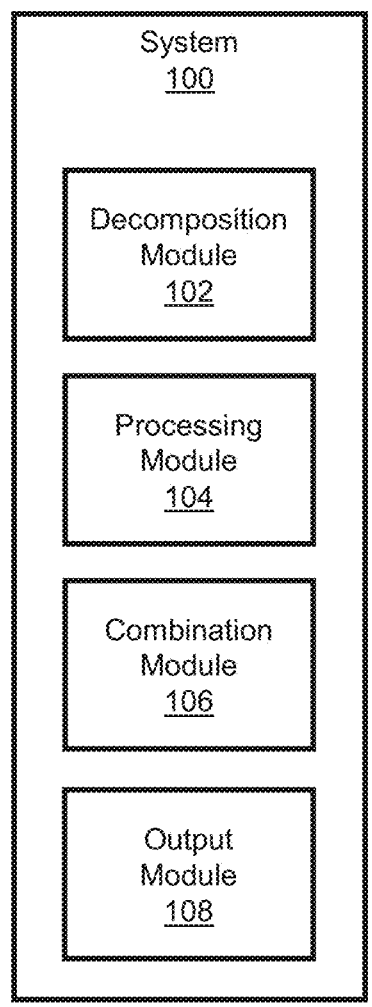
FIG. 1 is a schematic diagram of a system for linear signal processing with signal decomposition, in accordance with an embodiment.

Embodiments will now be described with reference to the figures. For simplicity and clarity of illustration, where considered appropriate, reference numerals may be repeated among the Figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

Various terms used throughout the present description may be read and understood as follows, unless the context indicates otherwise: "or" as used throughout is inclusive, as though written "and/or"; singular articles and pronouns as used throughout include their plural forms, and vice versa; similarly, gendered pronouns include their counterpart pronouns so that pronouns should not be understood as limiting anything described herein to use, implementation, performance, etc. by a single gender; "exemplary" should be understood as "illustrative" or "exemplifying" and not necessarily as "preferred" over other embodiments. Further definitions for terms may be set out herein; these may apply to prior and subsequent instances of those terms, as will be understood from a reading of the present description.

Any module, unit, component, server, computer, terminal, engine or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information, and which can be accessed by an application, module, or both. Any such computer storage media may be part of the device or accessible or connectable thereto. Further, unless the context clearly indicates otherwise, any processor or controller set out herein may be implemented as a singular processor or as a plurality of processors. The plurality of processors may be arrayed or distributed, and any processing function referred to herein may be carried out by one or by a plurality of processors, even though a single processor may be exemplified. Any method, application or module herein described may be implemented using computer readable/executable instructions that may be stored or otherwise held by such computer readable media and executed by the one or more processors.

The following relates generally to wireless communication, and more specifically, to a method and system for linear signal processing with signal decomposition.

A general limitation in high-linearity front-ends are the non-linear active devices. This is manifested as compression for large voltage swings, and weak-distortion for small voltage swings. Some mixer-first receivers deal with this problem by avoiding active elements in the front-end. In such receivers, the antenna is directly interfaced to a passive down-conversion mixer, feeding the signal into baseband where it is eventually filtered. Although excellent linearity can be achieved with such architectures, matching with passive elements can result in a noise figure (NF) greater than 3 dB, and the lack of amplification at the first stage can lead to the excessive power demand in the baseband to maintain low noise (e.g. 30 mW in baseband and 36 mW/GHz in LO).

In some cases, the noise figure problem in mixer first receivers may be alleviated by synthesizing impedances through feedback in the baseband (for high linearity), or by using an auxiliary active path for noise canceling, which generally becomes the linearity bottle-neck of the system. Both approaches require more power due to the active elements used. Therefore, for achieving low-power, low-noise amplifiers (LNA) are generally still required. To deal with compression concerns, low noise trans-conductance amplifiers (LNTAs) are mainly used, which can even be accompanied by transformers, to allow voltage swings larger than supply, and boost transconductance $g_m$. In this case, the current signal produced by the LNTA can be converted to voltage only after down-conversion and filtering. This helps with the output compression, but necessitates the use of very large switches in the mixer for low LNTA output impedance, which increases the power in frequency generation. Blocker-filtering techniques can help in this regard, which create sharp filtering profiles through the concept of impedance translation. This allows LNTAs to have lower output impedance at blocker frequencies, hence not develop much voltage for the large currents produced by the blockers. This approach can even allow the use of voltage mode LNAs, but those have lower compression points than current-mode. Creating such impedances is done through a non-linear switching process, and therefore requires multi-phase LO signals to avoid harmonic generation and burns considerable LO power. Impedance translation with multiple LO phases is, in a way, equivalent to N-path filtering which can be used in both active front ends and mixer first receivers for achieving high linearity, but also comes at the expense of power in frequency generation.

In most existing topologies, harmonic rejecting multi-phase mixers are used to reduce desensitization of the wanted signal due to the LO harmonics. Due to the inherent trade-off between noise and linearity, it is a substantial technical challenge to improve dynamic range (DR) without burning excessive power in either LNA or mixer or baseband.

In the absence of distortion, the dynamic range (DR) of an analog amplifier is generally limited by the maximum signal-to-noise ratio (SNR) achievable. The maximum SNR for a given bandwidth $\Delta f$ is typically limited to the input peak-to-peak voltage $V_{ipp}$ and the output peak current $I_{op}$ as follows:

$$SNR \cdot \Delta f = \frac{\frac{V_{ipp}^2}{8}}{\frac{4kT\gamma}{g_m}} = \frac{V_{ipp} \cdot \frac{V_{ipp} g_m}{2}}{4 \cdot 4kT\gamma} = \frac{V_{ipp} \cdot I_{op}}{16kT\gamma} \quad (A)$$

where k is Boltzmann's constant, T is the absolute temperature, $g_m$ is the amplifier transconductance, and $\gamma$ is the noise factor of the transconductor.

Typically, $V_{ipp}$ is bound by the supply voltage $V_{DD}$, and $I_{op}$ is bound by the supply current $I_{DD}$, therefore the above equation can be rewritten as a function of the power drawn from the supply (P) as follows:

$$SNR \cdot \Delta f = \frac{V_{DD}\eta_v \cdot I_{DD}\eta_c}{16kT\gamma} = \frac{P \cdot \eta_v \eta_c}{16kT\gamma} \quad (B)$$

wherein $\eta_v = V_{ipp}/V_{DD}$ and $\eta_c = I_{op}/I_{DD}$.

Instantaneous frequency can also be used in some approaches instead of $\Delta f$; particularly, for the cases where the noise is band-limited by an output capacitor. Maximizing voltage swings increases the voltage efficiency $\eta_v$ for each stage along the signal processing chain. Therefore, the desired signal is typically amplified to the rails as early as possible and maintained at this level; however, rail-to-rail linear amplification may introduce significant distortion. In the presence of larger interferers, the maximum amplification is generally further limited to avoid saturation.

Embodiments of the present disclosure provide quantized signal processing; for example, a quantized voltage amplifier (QA) illustrated in FIG. 3B. FIG. 3A illustrates a typical single amplifier while FIG. 3B illustrates a quantized voltage amplifier in accordance with the present embodiments. In this example, amplification is performed by using an array of unit amplifiers, each one dedicated to amplifying only a certain slice of the input signal. In this way, even if the output of a single unit is limited to $V_{DD}$, collectively the total output can exceed the supply. Advantageously, this can allow the present embodiments to have a voltage swing for a stage that follows be virtually much larger that $V_{DD}$ and to increase the maximum SNR achievable (i.e. greater dynamic range (DR)). Further advantageously, the signal quantization enables an improvement in the linearity of the overall transfer function since the voltage transfer characteristic of each element can be averaged among multiple units.

The amplifier illustrated in FIG. 3A has a voltage gain A and an output between ground and $V_{DD}$, and thus has an input range limited to $V_{DD}/A$. To extend both the input and the output voltage ranges, the QA of the present embodiments slices it into N identical units, each (ideally) consuming 1/N of the original current, as shown in FIG. 3B. This maintains the same power dissipation and area. However it should be noted that in some embodiments the quantization approach could lead also to a reduction of the power of the single unit. The input range of each unit is still limited to $V_{DD}/A$, but now each of them is responsible for amplifying only one portion of the input signal. To do that, an offset equal to $V_{DD}/A$ can be added between the inputs of adjacent amplifiers. In this way, the characteristics are shifted by $V_{DD}/A$, so that the overall input range becomes $N \cdot V_{DD}/A$. At the output of the QA, all of the signals can be added together, which leads to a virtual output range equal to $N \cdot V_{DD}$. In some cases, performing this summation without exceeding the supply is accomplished by recombining the N paths in the digital domain. This can translate the burden of having a larger supply to having more bits in the output register. Since the maximum input/output signal swings have been increased by N while keeping the same power consumption, from Equation (A) it follows that the maximum SNR achievable (i.e. DR) by the QA is N-times larger than for the single amplifier. Increasing signal power $N^2$-times and having N-times better SNR suggests that the input referred noise of QA is N-times larger than the input referred noise of the original amplifier. This is because each unit amplifier in the QA consumes N-times less current, and injects noise only when it is not saturated.

Figure 22B:
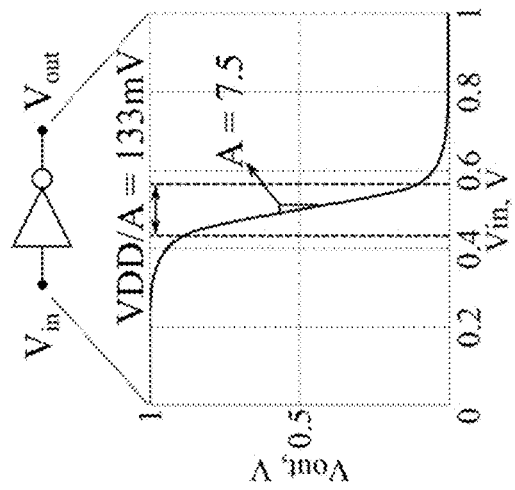
FIG. 22B shows a transfer function of the quantized inverter amplifier of FIG. 22A.
Figure 22A:
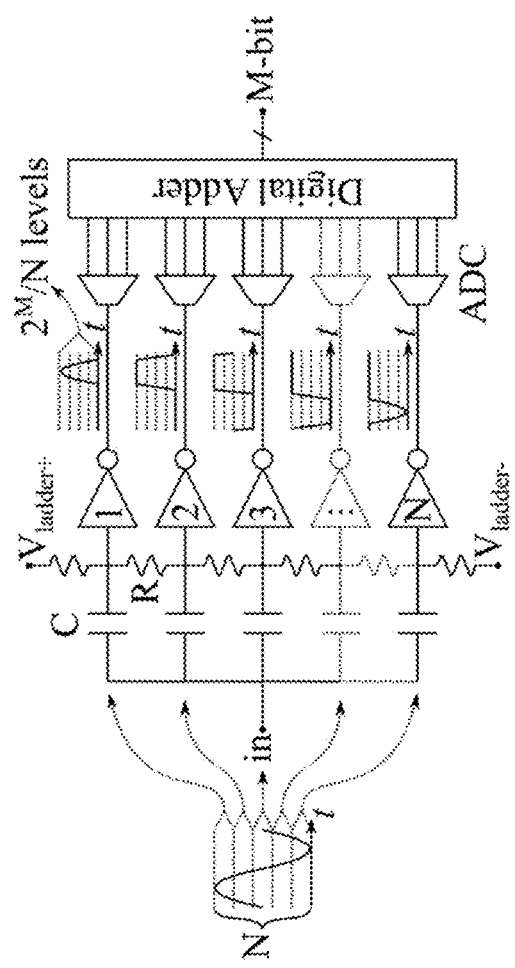
FIG. 22A illustrates a schematic example of the quantized inverter amplifier in accordance with the system of FIG. 1.
Figure 23C:
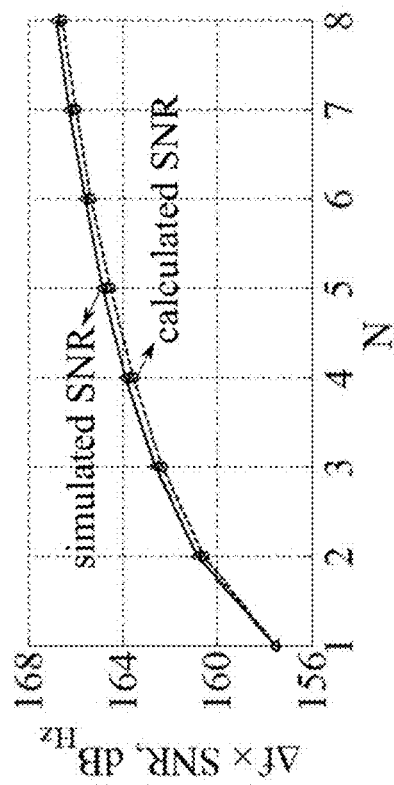
FIG. 23C is a chart showing signal-to-noise ratio (SNR) vs. decomposition quantity (N), for a signal for an example QA with $V_{ipp}$=N·133 mV at 1 GHz.
Figure 23D:
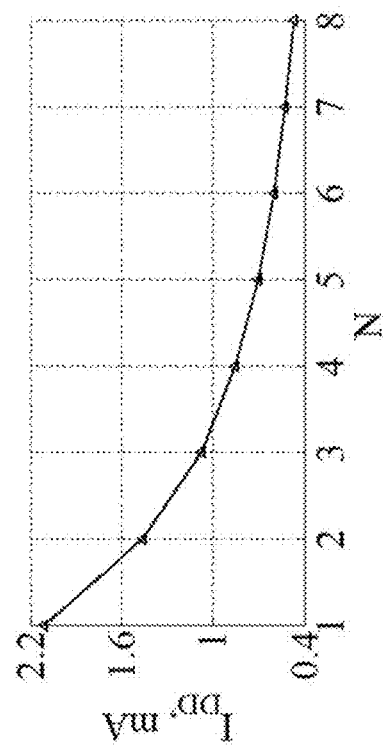
FIG. 23D is a chart showing $I_{DD}$ vs. N, for a signal for the example QA with $V_{ipp}$=N·133 mV at 1 GHz.
Figure 23A:
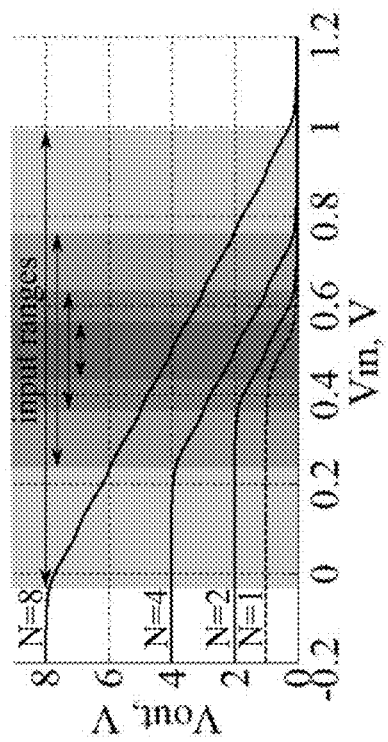
FIG. 23A is a chart showing $V_{out}$ vs. $V_{in}$, for an example inverter (N=1) and QA with N=2, 4, and 8.
Figure 23B:
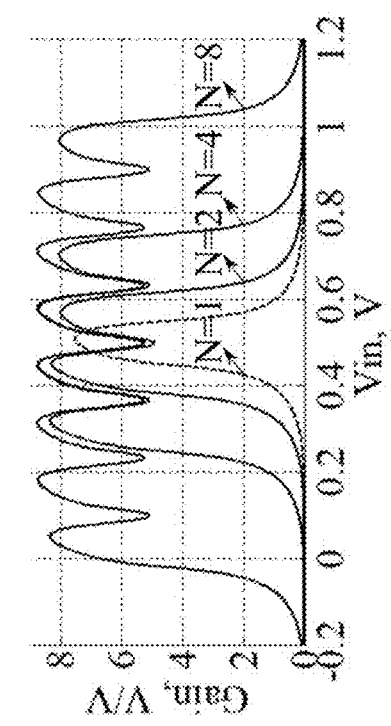
FIG. 23B is a chart showing Gain vs. $V_{in}$, for the example inverter (N=1) and QA with N=2, 4, and 8.

The present inventors have verified the QA of the present embodiments by implementing it through an array of inverter amplifiers in 65 nm CMOS with 1V supply, followed by an ADC to quantize and recombine the signals. FIG. 22A illustrates a schematic example of the quantized inverter amplifier and FIG. 22B shows the associated transfer function. Advantageously, it is not necessary to directly quantize the outputs of the inverters. Further analog signal processing (e.g. filtering or signal down-conversion) can be performed between the inverters and the ADCs since the recombination is a linear operation. The required DC offsets among the inverters can be generated through a resistive ladder by AC-coupling the input signal. In some cases, to make the noise and power dissipation of biasing negligible for a given input frequency range, the cut-off frequency of the RC bank can be reduced at the expense of increased area. This makes the proposed bias scheme more suitable for RF applications. Given the simulated CMOS inverter characteristic shown in FIG. 22B, the input range can be assumed to be $V_{DD}/A=133$ mV, where $A=7.5$ is the gain of the inverter at the midpoint. FIGS. 23A and 23B show the voltage transfer characteristics and gain, respectively, of the inverter QA for the number of slices N from 1 to 8 where the offset is set to $V_{DD}/A$ (i.e. 133 mV). Compared to the single inverter the input range increases by N. FIG. 23C shows a simulated SNR·$\Delta f$ for the QA as a function of N, computed at the output, in response to a 1 GHz signal of the largest amplitude ($V_{ipp}=N \cdot 133$ mV). As expected, the SNR increases with N, and corresponds closely to the linear relation of $SNR_{QA}=N \cdot SNR_{INV}$, shown with dashed lines. Notice that this would correspond to the increase in DR if the distortion introduced by the gain ripple observed in FIG. 23B is neglected. Moreover, ADCs can be assumed to be ideal, with enough number of bits to make the quantitation noise negligible. FIG. 23D shows the total current dissipation which decreases as N increases. This current dissipation should not depend on N for a 100% current efficient amplifier (i.e. $\eta_c=1$); however, in this case, the inverter is not 100% efficient as it operates in class-AB by having a direct-path current between $V_{DD}$ and ground when both transistors operate in saturation. When N is increased, each unit saturates faster, being driven by a large input signal, and spends less time in the region where the direct-path current is consumed. This is another substantial advantage of the QA of the present embodiments for enabling the minimization of power consumption in practical implementations.

Figures 24A, 24B:
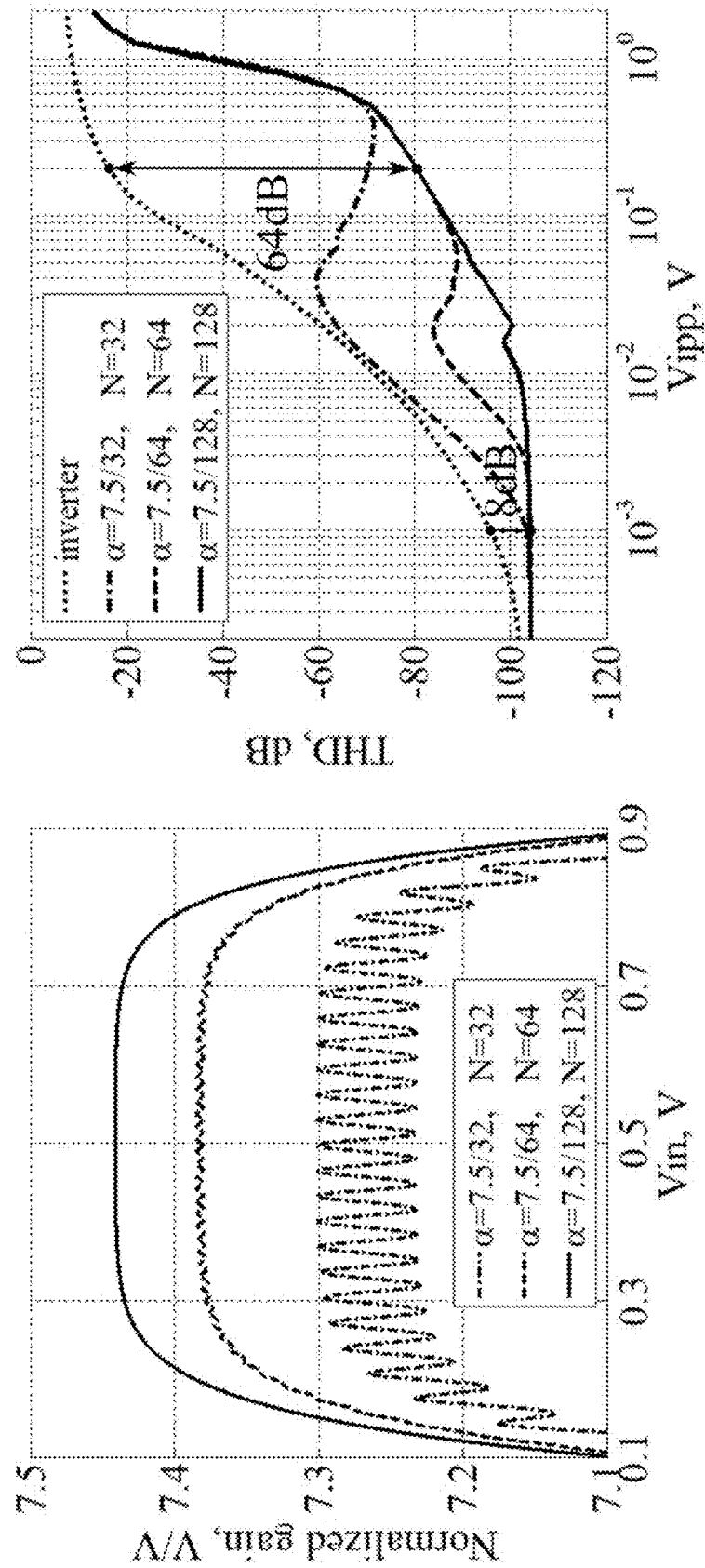
FIG. 24A is a chart showing Gain vs. $V_{in}$ for a simulated example QA with $\alpha$=7.5/32, 7.5/64, and 7.5/128.
FIG. 24B is a chart showing THD vs. $V_{ipp}$ for a simulated inverter and the simulated QA.

The gain ripple observed in FIG. 23B can be greatly reduced by allowing the gain characteristics to overlap more than $V_{DD}/A$, through reducing the offsets between the inverters ($V_{off}$) by a factor of $\alpha$ (i.e setting $V_{off}=\alpha \cdot V_{DD}/A$). Since this operation would decrease the input range by $\alpha$, N must be increased by the same factor to maintain the original input range. This was done in example simulations shown in FIG. 24A, where a larger overlap was obtained by reducing $\alpha$ and increasing N to keep the same input range. The gain ripple is improved from 0.9% ($\alpha=7.5/32$, N=32) to 0.0001% ($\alpha=7.5/128$, N=128). Notice that a greater overlap of the characteristics (i.e. smaller $\alpha$ and larger N) also increases the effective gain by $1/\alpha$, because the input range is kept constant (i.e. $\alpha \cdot N \cdot V_{DD}/A$) while the virtual output range increases being equal to $N \cdot V_{DD}$. However, since in the presence of an overlap signals in adjacent paths are partially correlated, this increment in gain is redundant and it does not lead to a benefit in terms of SNR. This explains why the comparison in FIG. 24A can be done by normalizing the gains by $1/\alpha$. The linearity improvement can be evidenced by evaluating the total harmonic distortion (THD) produced as a function of the input signal amplitude $V_{ipp}$, as shown in FIG. 24B. For small signal amplitudes (i.e. $V_{ipp}=1$ mV) the THD of the QA improves by 8 dB compared to the one generated by a single inverter. This improvement reaches of 64 dB for larger signal amplitudes (i.e. $V_{ipp}=200$ mV), where the single inverter is almost saturated while the QA takes advantage of larger input/output ranges.

Figures 25A, 25B:
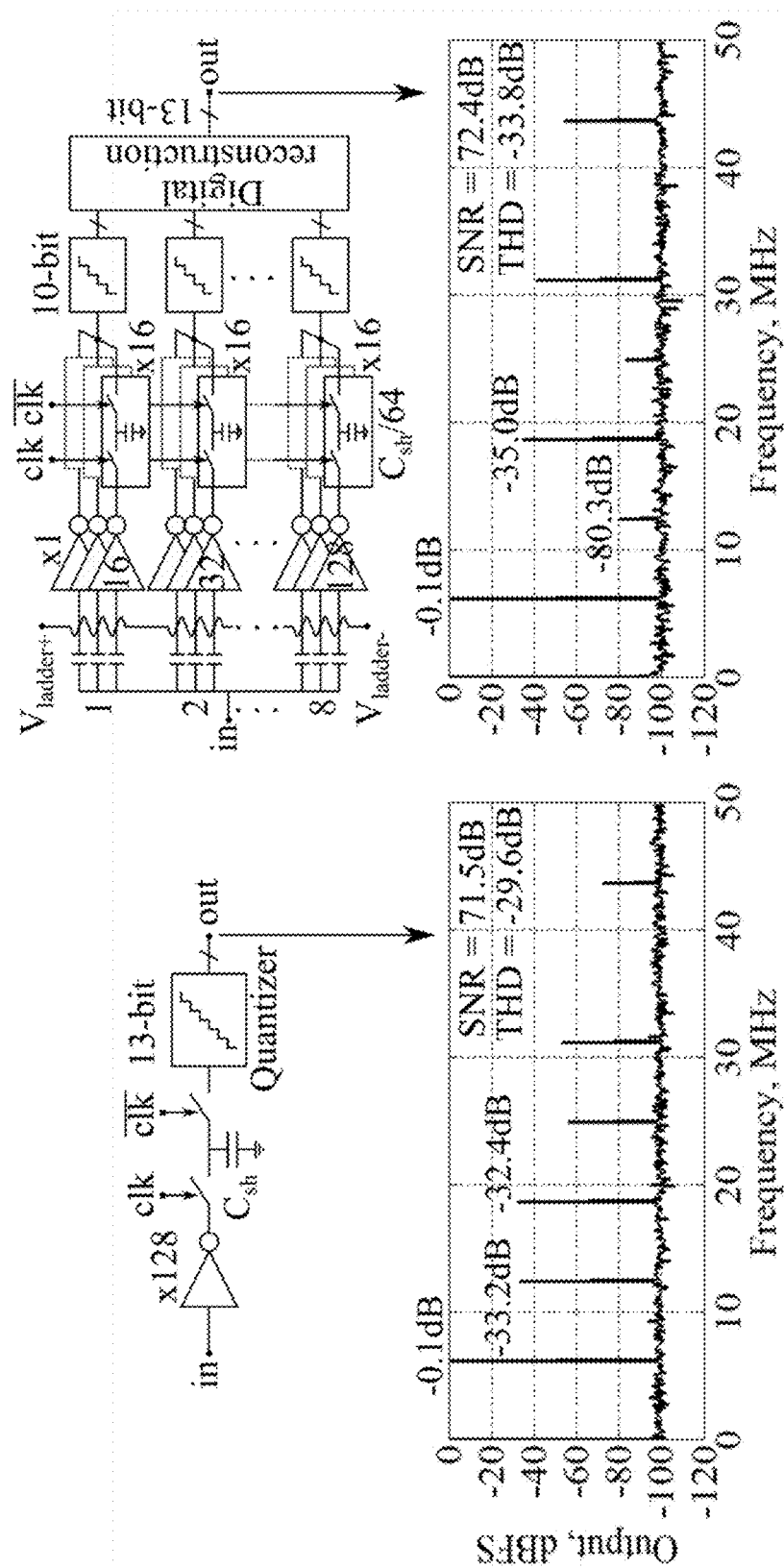
FIG. 25A shows an example transient noise simulation of an example cascade of a single inverter amplifier with a 13-bit analog-to-digital convertor (ADC)
FIG. 25B shows an example transient noise simulation of an example 128-unit QA followed by eight 10-bit ADCs.

For applications where an analog-to-digital conversion (ADC) is ultimately required; for example, wireless/wireline receivers or sensor interfaces, ADCs can be used to perform the signal recombination in the digital domain. Indeed, because of the virtual expansion of the output range beyond $V_{DD}$, the ADCs required to recombine the QA outputs in the digital domain can consume less power than a single ADC driven by a single amplifier. This can be understood intuitively by considering the case when the signal is sliced into N pieces without an overlap (i.e. $\alpha=1$). In this case, to reach the same dynamic range (DR) as a single M-bit ADC, each ADC of the QA needs $2^M/N$ quantization levels. For the same figure-of-merit (FoM), the reduction of the DR of ADC by N times demands $N^2$-times less power. With N ADCs in total, the overall power consumed for the analog to digital conversion will be N times smaller compared to the traditional approach. In presence of an overlap (i.e. $\alpha<1$), the power dissipation would scale down by a factor of $N \cdot \alpha$ instead of N. The present inventors have verified this benefit by an example transient noise simulation of the two cases shown in FIGS. 25A and 25B: the cascade of a single inverter amplifier with a 13-bit ADC, and a 128-unit QA (with an overlap factor $\alpha=1/16$) followed by eight 10-bit ADCs, respectively. The resolution of each ADC in the case of the QA was relaxed by 3-bits, since $N \cdot \alpha \approx 8$. The redundancy due to $\alpha=1/16$ allowed the recombination of the QA outputs in groups of 16, while keeping a virtual expansion of $V_{DD}$ by 8 (i.e. $N \cdot \alpha$). This allowed using only 8 ADCs instead of 128. The recombination takes place in the sample-and-hold (SH) by merging the 16 sampling capacitors coming from the 16 QAs, as shown in FIGS. 25A and 25B. The ADCs were modelled by the cascade of a noisy SH circuit and an ideal quantizer. The sampling capacitor was sized to make the ADCs thermal noise limited with an effective number of bits (ENOB) equal to 12. In particular, the sampling capacitor of the 13-bit ADC is 64 times larger than the one of each 10-bit ADC (formed by 16 sampling capacitors in parallel). For a given FoM, such sizing would make the total power dissipation of the QA ADCs 8 times less than the one of a 13-bit ADC, while keeping the same DR (or ENOB). This was confirmed by the simulation results shown in FIGS. 25A and 25B, where similar SNRs (72 dB) were obtained in both cases for a full-scale input signal at 6.25 MHz sampled at 100 MHz. Notice that, while the SNR is set to be dominated by the ADCs (to appreciate the impact of a reduction of the number of bits in the QA ADCs), the linearity of the system is limited by the analog amplifier. The THD of QA is 4.2 dB better, even with an input signal N·α 8 times larger than the one feeding the single amplifier, illustrating the substantial benefit of the present embodiments.

Embodiments of the present disclosure also provide a receiver with an analog front-end implemented using a quantized analog (QA) architecture. The quantized-analog amplification increases the input range of an amplifier for a given power dissipation above the nominal supply, improving the DR for a given power consumption and allowing voltage-mode operation even at very low voltage supplies. In the context of a receiver, the former property is exploited to obtained operation without surface acoustic wave (SAW) devices, while the latter to implement a novel harmonic rejection mixer architecture. The quantization of the analog signal path allows the present embodiments to also exploit multi-tanh linearization leading to an improvement of small signal distortions such as IP2 and IP3. The DR and spurious-free dynamic range (SFDR) of the QA of the present embodiments can be easily reconfigured, which makes it possible to adapt the receiver to blocking scenarios and minimize power consumption.

Referring now to FIG. 1, a conceptual diagram of a system 100 for linear signal processing with signal decomposition, in accordance with an embodiment, is shown. FIG. 1 diagrammatically shows various physical and logical components of an embodiment of the system 100. The system 100 comprises a decomposition module 102, a processing module 104, a combination module 106, and an output module 108. Embodiments of each of the modules 102, 104, 106, 108 will be described in greater detail herein. The functions of modules 102, 104, 106, 108 can be implemented in hardware or via a processor.

The decomposition module 102 slices an along input signal in amplitude into multiple slices. The processing module 104 processes each slice along a separate path. In an example, the input signal can be sliced by the decomposition module 102 and the processing module 104 can use an array of amplifiers to each amplify one of the paths. In another example, the input signal can be sliced by the decomposition module 102 and each slice can be translated in frequency and amplified by the processing module 104. After the signal is sliced and processed in an array of paths, the signal can be recombined by the combination module 106; for example, by summing together the paths. The combination module 106 can combine the separate paths in either the digital or analog domain. In some cases, the separate paths can be outputted by the system 100 and the combination can be performed as part of another system; for example, as part of a separate amplifier. Since the recombination is a linear operation, the system 100 can be applied to any linear analog signal processing; for example, amplification, mixing, filtering, convolution, frequency translation, optical driving, and the like.

In some cases, for any input signal, the signal decomposition (slicing) by the decomposition module 102 can produce a mixed-signal with a digital component and an analog component. In this case, the digital component can be extracted by a saturated path and the analog component by an unsaturated path.

Advantageously, the system 100 can expand a dynamic range of the processing, and can relax the power demand of any following stages as the total output swing can virtually exceed the supply voltage. In the embodiment with multiple amplifiers, using the multiple amplifiers advantageously help linearize input-output transfer characteristic by increasing the correlation of the signal between adjacent slices (i.e., overlap). Additionally, the ability to use the saturated lines (i.e., the digital component) are advantageous because it can expand the dynamic range without introducing analog noise and distortion. When the signal is sliced, each portion is processed individually, for example, amplified. Typically, the signal processing in each path is not perfectly linear because of the non linearity present in the circuits. In particular, in each path the signal tends to be compressed when approaching the saturation of the path. Such distortion, which occurs in each path, produces a distortion in the overall characteristic of the system. However it is possible to reduce the overall distortions by creating an overlap between adjacent slices by reducing the offset between them. This happen because the overlap allows to average the distortion among the slices. This can be seen in FIG. 24A where the ripple in the gain is reduced, increasing the overlap.

While the present disclosure may be based on the example of an amplifier and of a receiver, it is understood that the present embodiments can be applied to any linear operation occurring between signal decomposition and recombination, as described herein.

Figure 2:
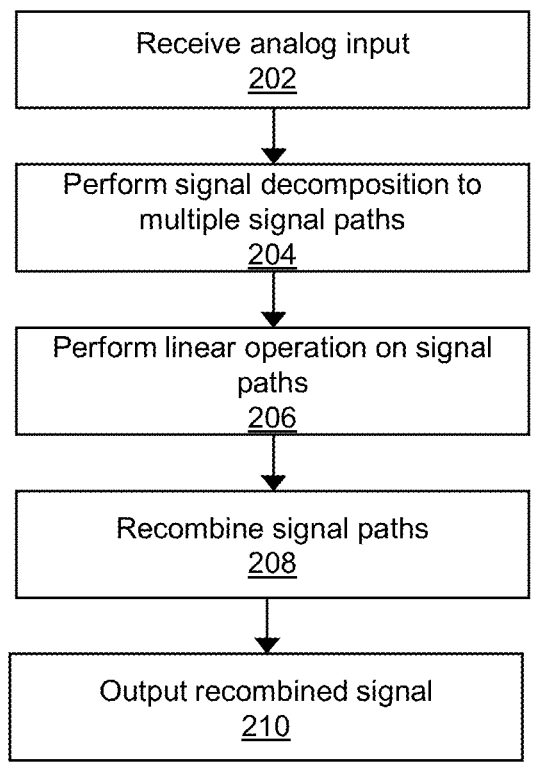
FIG. 2 is a flow chart of a method for linear signal processing with signal decomposition, in accordance with an embodiment.

FIG. 2 is a flow chart of a method 200 for linear signal processing with signal decomposition, in accordance with an embodiment.

At block 202, the decomposition module 102 receives an analog input signal. At block 204, the decomposition module 102 performs signal decomposition of the analog input signal by slicing the analog input signal into a plurality of slices by amplitude and directing each slice to a separate signal path. The signal decomposition produces a mixed-signal with one or more digital components and one or more analog components, with each of the components on a separate path. In some cases, the saturated paths can be the digital components and the unsaturated paths can be the analog components. In some cases, the analog components can take a range of values, for example from ground to supply. Advantageously, in some cases, the digital component can be extracted from the saturated path and the analog component can be extracted from the unsaturated path; for example, prior to recombination.

At block 206, the processing module performs a linear operation on the decomposed signal on each signal path. The linear operation can be, for example, amplification, mixing, filtering, convolution, frequency translation, optical driving, and the like. In some cases, the linear operation can include multiple operations performed on each signal path.

At block 208, in some cases, the signal is recombined by the combination module 106; for example, by summing together the paths in either the digital or analog domain, or both.

At block 210, where the combination module 106 recombined the signal, the output module 108 outputs the recombined signal. In other cases, the output module 108 merely outputs one or more of the signal paths. In these cases, the signal paths can be combined at a further stage or in a further system, or can remain uncombined.

Quantized inverter amplifiers of the present embodiments can have a complementary metal-oxide-semiconductor (CMOS) amplifier sliced into multiple elements, where each one is dedicated to amplify only a portion of the input signal. Such signal decomposition can lead to several benefits, such as expansion of both input and output ranges of the amplifier, improvement of the SNR for a given power, and minimization of the small-signal distortions. Advantageously, in the case of the quantized-analog amplification, the signal remains analog also after the decomposition in multiple paths.

If one considers the amplifier in FIG. 3A, with an input-output characteristic defined as follows:

$$y(x) = \begin{cases} 0 & x < -\frac{V_R}{2} \\ f(x) & -\frac{V_R}{2} \leq x \leq \frac{V_R}{2} \\ VDD & x > \frac{V_R}{2} \end{cases} \quad (1)$$

where f(x) is a continuous function between the input and the output, VR represents the maximum input range of the amplifier before saturation and [0,VDD] is the output range.

When the amplifier is quantized in N+1 slices (where N is an even number), as shown in FIG. 3B, the overall transfer function becomes:

$$g(x) = \sum_{i=-\frac{N}{2}}^{\frac{N}{2}} y(x - i\Delta V) \quad (2)$$

where $\Delta V$ is an offset applied at the input of each slice properly scaled upon the position i (which is limited between $-N/2$ and $N/2$).

When $\Delta V \neq 0$, Equation (2) can be rewritten as a function of the unit amplifier characteristic f(x) as:

$$g(x) = \sum_{i=-\frac{N}{2}}^{D1(x)} V_{DD} + \sum_{i=D1(x)+1}^{D0(x)-1} f(x - i\Delta V) + \sum_{i=D0(x)}^{\frac{N}{2}} 0 \quad (3)$$

with $$D_1(x) = \left\lfloor \frac{x - \frac{V_R}{2}}{\Delta V} \right\rfloor \quad (4)$$

$$D_0(x) = \left\lceil \frac{x + \frac{V_R}{2}}{\Delta V} \right\rceil \quad (5)$$

$D_1(x)$ and $D_0(x)$ produce two integer values obtained from floor and ceiling of functions of the input signal x, Equation (4) and Equation (5) respectively. The three series in Equation (3) are representative of the status of the different slices: the ones from $-N/2$ to $D_1(x)$ are saturated to the supply voltage ($V_{DD}$) (corresponding to an equivalent digital value "1"), the ones between $D_1(x)+1$ and $D_0(x)-1$ are working as analog amplifiers, and the ones from $D_0(x)$ to $N/2$ are saturated to ground (corresponding to an equivalent digital value "0"). Note that, although some slices are saturated, the overall output g(x) does not saturate if the input signal x is confined between $(-V_R - N\Delta V)/2$ and $(V_R + N\Delta V)/2$. Hence, compared to the original amplifier, the input range increases from $V_R$ to $V_R + N\Delta V$.

Figure 4:
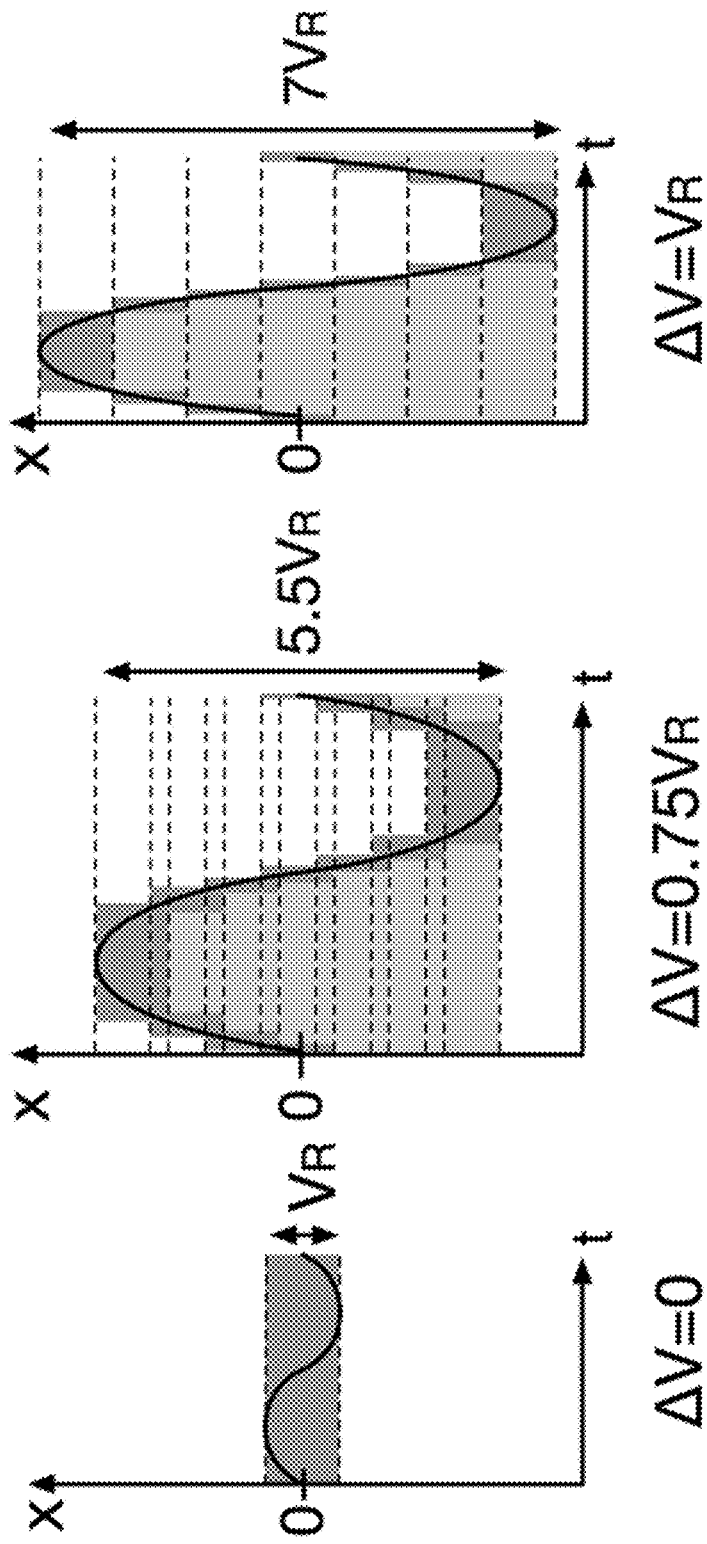
FIG. 4 shows examples of input range expansion for different $\Delta V$.

FIG. 4 shows input range expansion for different $\Delta V$ (N=6). FIG. 4 shows a sinusoidal input-signal with the maximum amplitude that does not saturate the QA amplifier. In FIG. 4, the status of the different slices are illustrated: saturated to VDD, unsaturated, or saturated to ground. When $\Delta V=0$, all the slices are completely overlapped and unsaturated, so the input range of the QA amplifier is equal to the original amplifier (i.e. VR). When $\Delta V=0.75$ VR, there is a partial overlap among the characteristics but, due to some saturated slices, the input range increases. The maximum input range is obtained for $\Delta V=VR$ (third case), when at any x, only one slice is unsaturated.

Equation (3) can be rewritten in a more compact form as:

$$g(x) = D(x) \times V_{DD} + \sum_{i=D1(x)+1}^{D0(x)-1} f(x - i\Delta V) \quad (6)$$

where D(x) is an integer number corresponding to the digital thermometric code produced by the saturated lines given by:

$$D(x) = D_1(x) + 1 + \frac{N}{2} \quad (7)$$

Equation (6) is composed of two parts: a pure digital component, defined by D(x) (i.e. digital bits), and an analog residue produced by the unsaturated slices digitally undefined, that are referred to as liquid bits. Notice that, while in a traditional mixed signals circuit analog and digital domains are separated by a fixed interface (i.e. ADC and DAC), in this case, each slice swings between its analog and digital states upon the value of the input signal. Like in digital signals, the saturated slices do not introduce analog-noise or distortion during the signal reconstruction. On the other hand, the analog residue preserved in the liquid bits allows the system to eliminate quantization noise produced by the digital component, but may introduce analog-noise and distortion during the signal reconstruction.

The expression of the gain of the QA amplifier can be obtained from the derivative of Equation (3) that becomes:

$$g'(x) = \begin{cases} N \times f'(x) & \Delta V = 0 \\ \sum_{i=D1(x)+1}^{D0(x)-1} f'(x - i\Delta V) & \Delta V \neq 0 \end{cases} \quad (8)$$

Figure 5:
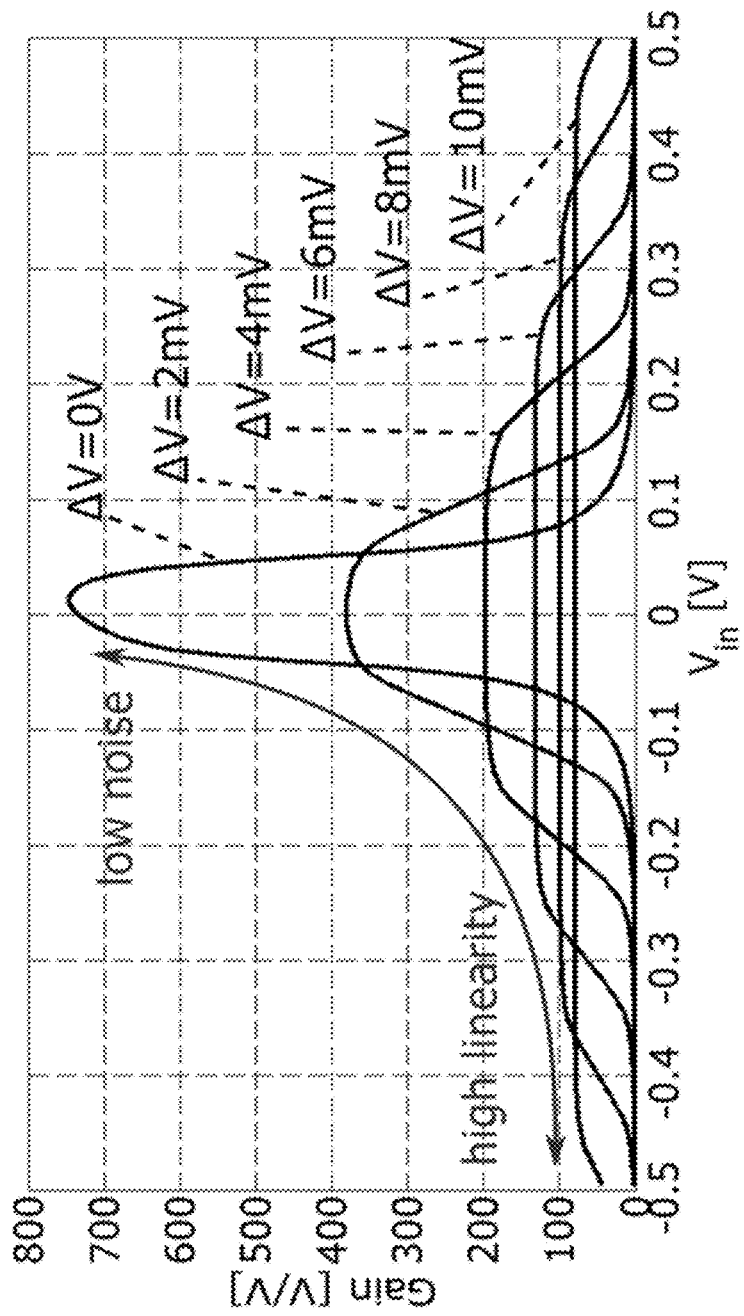
FIG. 5 illustrates a chart of an example simulation of low-noise amplifier (LNA) gain after reconstruction ($A_{QA}$) as a function of $\Delta V$.

Equation (8) shows that the overall analog gain depends only on the unsaturated slices and increases with the overlap (i.e. if $\Delta V$ decreases). The maximum gain, equal to N times the gain of the original amplifier f'(x), is obtained for $\Delta V=0$. On the other hand, the minimum gain (equal to f'(x)) is obtained for $\Delta V=V_R$ when there is only once unsaturated slice at the time. This behaviour is confirmed by a simulation conducted by the present inventors of the gain of the QA amplifier used as LNA in this design ($A_{QA}$) shown in FIG. 5. FIG. 5 illustrates a chart of an example simulation of LNA gain after the reconstruction ($A_{QA}$) as a function of $\Delta V$; using $V_R=80$ mV for the amplifier.

When $\Delta V=0$, the peak of the overall gain is equal to the peak of the gain of the single unit (for example, 7) times the number of elements (for example, 100). In this case, the overall input range is equal to the input range of the single unit $V_R$ that is 80 mV for a minimum gain 3 dB below the peak. The gain rapidly decreases as the overlap among the slices diminishes, while the input range increases approximatively to 1V (i.e. $V_R+N\Delta V$).

As it can be seen from FIG. 5, the gain of the single slice (i.e. f'(x)) defines the shape of the overall gain (i.e. g'(x)) and with it both compression point and weak distortions (for example, IP2 and IP3). The weak distortions can be studied through the series expansion of the characteristic around a given bias point, using higher order derivatives of g(x). If y(x) is $C^\infty$, it is possible to verify that, starting from Equation (8), the expression of the i-th order derivative $g^{i-th}$ (x) is equal to:

$$g^{i-th}(x) = \begin{cases} N \times f^{i-th}(x) & \Delta V = 0 \\ \sum_{i=D1(x)+1}^{D0(x)-1} f^{i-th}(x - i\Delta V) & \Delta V \neq 0 \end{cases} \quad (9)$$

Equation (9) suggests that small-signal linearity of g(x) depends only on the liquid component of g(x) and can be improved by choosing properly $\Delta V$ to minimize $g^{i-th}(x)$. In general multi-tanh analysis, the linearization occurs in current where the voltage to current transfer characteristics of a bipolar differential pair resembles a tanh function. In the present embodiment, linearization can rely on the voltage to voltage transfer characteristics of a CMOS inverter that also resembles a tanh function.

In a multi-tanh approach, the general goal is only to minimize the small signal distortion (by averaging the non-linear gains of the paths). Therefore, the offsets and the number of slices can be chosen so that for any input voltage all the slices are unsaturated. The quantized analog amplification of the present embodiment is a substantial improvement as it can also add saturated lines to improve the large signal distortion (e.g. compression point) and to lower the noise (at a given power).

Advantages of the present embodiments over the multi-tanh approach can be exemplified in the approach to choose the number of slices. In the multi-tanh approach, $\Delta V$ and N are generally chosen so that for each point of the characteristic all the slices produce unsaturated currents that concur to minimize the high-order derivatives (as in Equation (9)). For this reason, for an optimum $\Delta V$, N is typically small (e.g. 5), because due to the exponential characteristic of a bipolar device, the characteristic of each unit saturates very fast.

In the quantized-analog amplification of the present embodiment, an objective can be to increase the DR of the amplifier. As shown in FIG. 4, the input range of the QA amplifier can be maximized by maximizing the number of the saturated lines (i.e. the digital component of g(x)). This can be done by increasing $\Delta V$ or alternatively by increasing N. A large number of saturated lines can not only lead to a larger input range, but also to a larger DR for a given power, since the saturated lines (being "digital") do not introduce analog-noise, and by operating in voltage mode, they do not consume additional static power. In this way, in the QA amplifier of the present embodiments, N can be much larger than in the multi-tanh approach. In this way, $\Delta V$ can be chosen to minimize the weak distortions, while N can be determined by the target input-range, which is defined by $V_R+N\Delta V$.

When the amplifier is sliced into N sub-units, the input-referred noise of each amplifier increases by a factor N, because each slice is biased with 1/N of the current to keep the same power dissipation of the original amplifier. However, despite such increase in the input-referred noise, when $\Delta V$ is increased the DR increases too. This relationship happens because the allowable input/output signal swings increase, while the number of unsaturated lines decreases, which are the only ones that produce noise at the output. This effect is illustrated in FIG. 4.

Although the DR of an analog system is the primary parameter that limits the bit-error-rate in demodulation of a signal, for a wireless RF front-end, the input referred noise is also a crucial parameter, as it defines the noise figure (NF) and with it the sensitivity of the receiver. In absence of large signals (i.e. sensitivity test), the dependence of NF on $\Delta V$ can be described analytically by assuming an equal input referred noise spectral density of $v_n^2$ for each slice. Since in the sensitivity case the input signal is very small, a small-signal analysis can be performed. In this case, the overall noise at the output of the QA amplifier is given by the sum of the noises produced by the unsaturated slices as in the following:

$$v_{n,out}^2 = \sum_{i=D1+1}^{D0-1} v_n^2 |f'(i\Delta V)|^2 \quad (10)$$

where $D_1$ and $D_0$ are obtained from Equation (4) and Equation (5), respectively, with x=0 and f'(i$\Delta$V) is the gain of the ith unsaturated slice.

To evaluate the expression of the NF (with respect to a source resistance of RS), the noise spectral density produced at the output of the QA can be referred to the input through the small signal gain expressed by Equation (8) as in the following:

$$NF = 1 + \frac{\sum_{i=D_1+1}^{D_0-1} v_n^2 |f'(i\Delta V)|^2}{4kTR_S \left| \sum_{i=D_1+1}^{D_0-1} f'(i\Delta V) \right|^2} \quad (11)$$

where the second term of Equation (11) represents the noise produced by the unsaturated units divided by the noise produced by the source at the output.

By acting on $\Delta V$ it is possible to vary $D_1$ and $D_0$ (see Equation (4) and Equation (5)), and therefore, the achievable NF.

The minimum NF (but also the smaller input range) can be obtained for $\Delta V=0$. In this case, all the slices are in parallel and Equation (11) can be rewritten as:

$$NF = 1 + \frac{vn^2}{4kTR_S N} \quad (12)$$

This case can represent the best configuration in terms of NF, but possibly the worst in terms of DR. When $\Delta V=V_R$ (i.e. only one slice unsaturated), both the DR and NF reach their maximum and Equation (11) becomes:

$$NF = 1 + \frac{vn^2}{4kTR_S} \quad (13)$$

The variation of $\Delta V$ is a primary parameter of reconfigurability since it can control noise, weak distortion, and the compression point; which define DR and SFDR. In this way, the quantized RF front-end of the present embodiments can increase the DR only in presence of an interferer. Additionally, the present embodiments are advantageous over a variable gain control because, fundamentally, a mere variation of the gain in front of a stage for a variable gain control cannot change its DR as both noise and compression point are scaled by the same factor.

The present embodiments can use a linear recombination to reconstruct the amplified signal. For cases that are ultimately terminated by an ADC, this recombination can be performed in the digital domain. In other cases, the signal can be recombined in the analog domain by adding the signals such that the overall output swing does not exceed the nominal supply. This can be accomplished using, for example, a trans-impedance amplifier (TIA).

Figure 6:
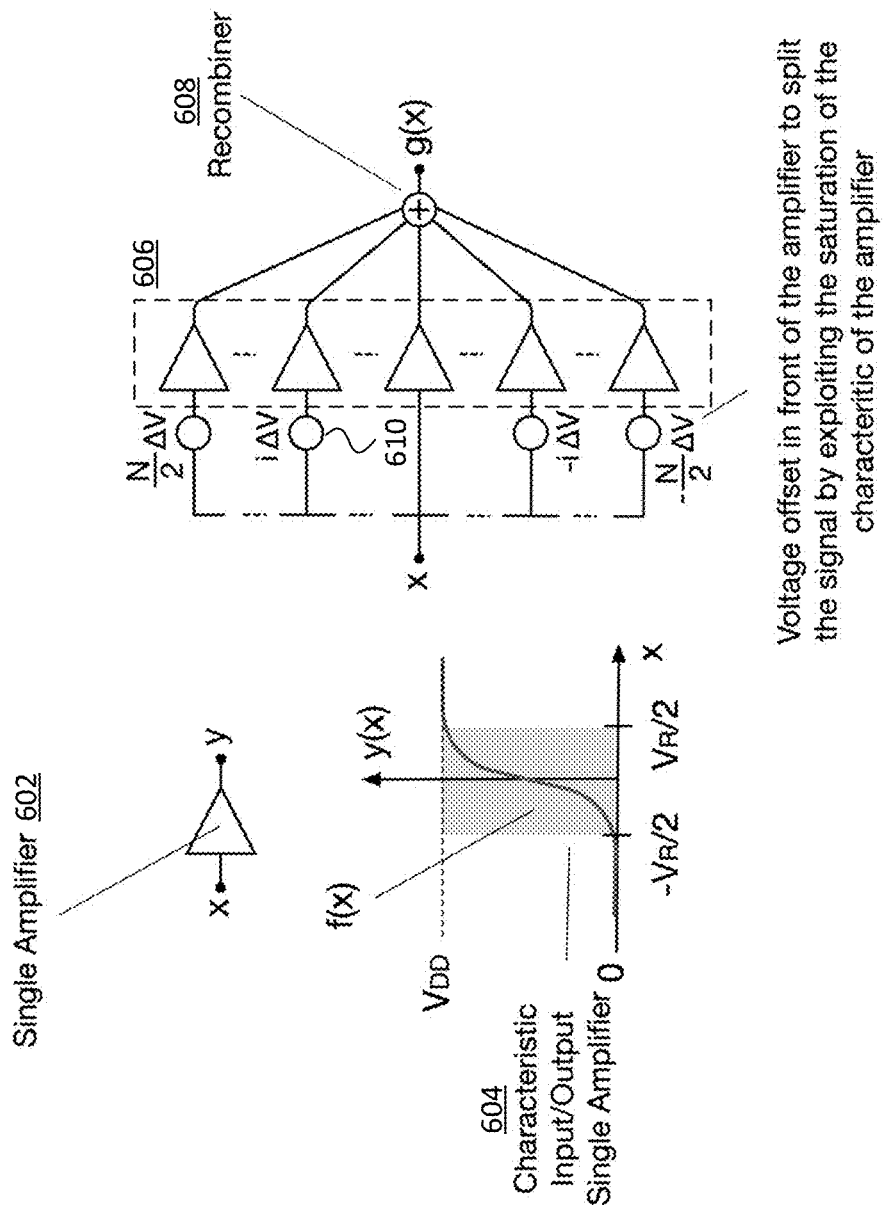
FIG. 6 illustrates a diagrammatic example implementation of a quantized inverter amplifier (QA) in accordance with the system of FIG. 1.

FIG. 6 illustrates a diagrammatic example implementation of the QA amplifier of the present embodiments. FIG. 6 illustrates a single amplifier 602 and a characteristic input/output 604 of the single amplifier 602. FIG. 6 also illustrates an example quantized amplifier 606 with a recombiner 608 at the output and a voltage offset 610 in front of each amplifier to split the signal by exploiting the saturation of the characteristic of the amplifier.

Figure 7:
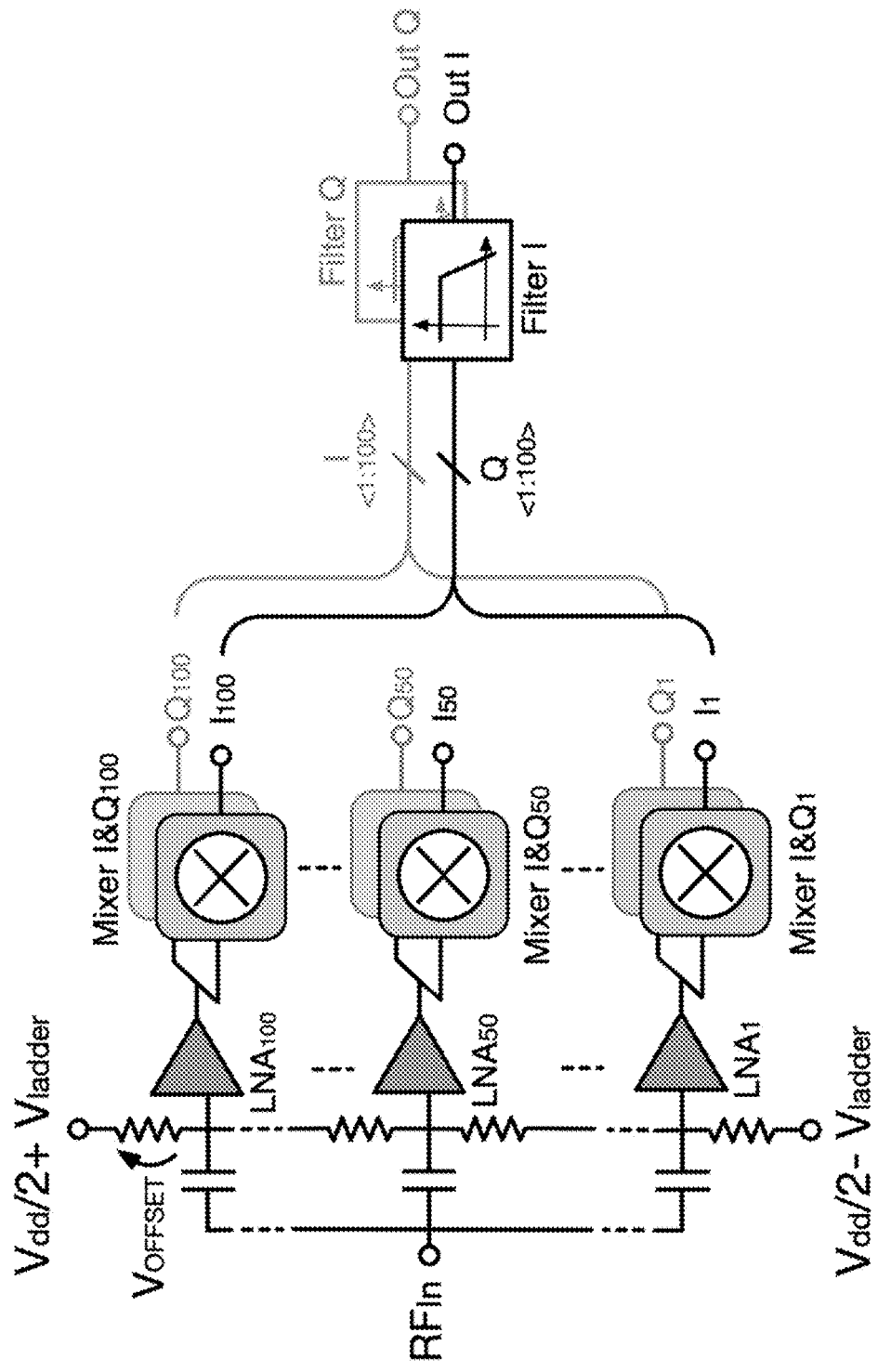
FIG. 7 is a schematic of an example of a QA receiver front-end in accordance with the system of FIG. 1.

While the above describes the present embodiments of signal decomposition to the QA amplifier example, the present embodiments can be applied to any linear signal processing; for example, as shown in the QA RF front-end exemplified in FIG. 7. An RF front-end is split in multiple (for example, 100) RF front-end units (i.e. the QA slices) that are recombined after the mixer by summing the current outputs using a transimpedance amplifier (TIA). In a particular case of the present embodiments, each RF front-end unit can be comprised of an LNA, a harmonic-rejection mixer, and a frequency divider, while the baseband is implemented with two differential TIAs which provide I and Q outputs. Notice that, by having a mixer in a QA slice does not disrupt the operation, since the down-conversion can be a time-variant linear operation. Offsets between the QA slices can be generated through a resistive ladder, and the input can be AC-coupled. In this example, all the LNAs share the same supply (i.e. 0.8V) while $V_{ladder}$ is used to reconfigure the offsets $\Delta V$, thereby making the front-end adaptive to various DR, noise, and compression requirements as previously discussed. Since the overall DR generally depends on the input-referred noise of the unit element, in an example, a granularity of 100 elements can be used for having a fine tuning of the noise figure (NF) and the DR.

Figure 8:
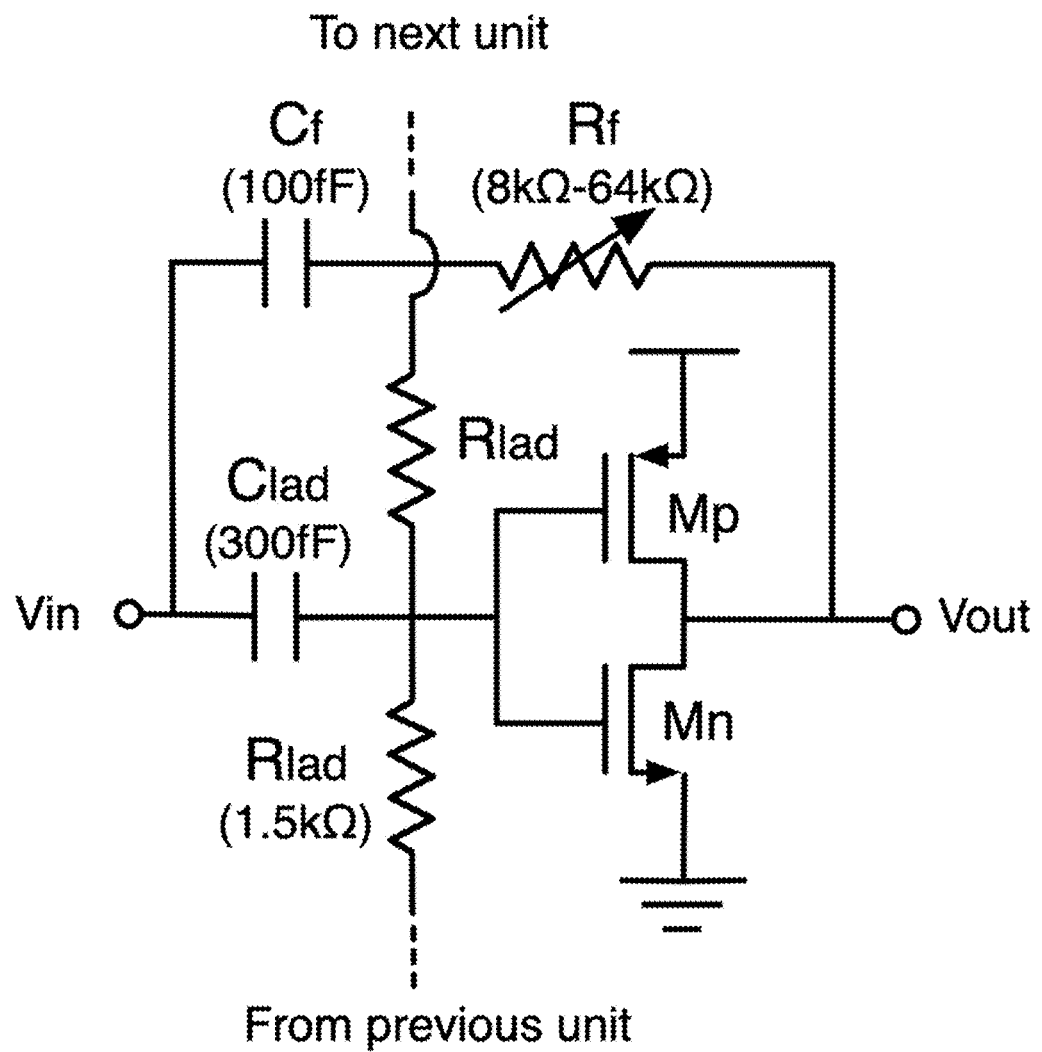
FIG. 8 is a schematic of an example of an LNA with resistive feedback matching in accordance with the system of FIG. 1.

FIG. 8 shows a schematic of an example of an LNA with resistive feedback matching. It is composed of an inverter-based voltage-mode amplifier, with a resistive feedback matching. The LNA is biased through the resistors $R_{lad}$ that belong to the resistive ladder shown in FIG. 7. The RF input is AC-coupled by the capacitor $C_{lad}$. The inverter can be sized to have large enough $g_m$ to meet a minimum NF requirement, which can be obtained when all 100 slices are in parallel (zero DC-offset in the ladder). The bias points of NMOS and PMOS transistors in the inverter can be selected to achieve the highest current efficiency for the maximum $g_m$. This can be accomplished by setting the inverter supply voltage to the sum of the two required $V_{GS}$ values. In an example, this can correspond to a supply voltage of 800 mV for the $g_m/I_d$ of 15V$^{-1}$. Notice that the supply of the LNA can define only the input range of the single slice (i.e. $V_R$=80 mV), while overall input range of a QA structure (being equal to $V_R$+N$\Delta V$) can be customized by varying the DC-offset $\Delta V$ between 0 and 10 mV (i.e., $V_{ladder}$ between 0 and 0.5V).

In an example of the quantized analog receiver, in accordance with the present embodiments, a resistive feedback network can be used to match to an antenna, for example, a 50$\Omega$ antenna. Each slice draws a current proportional to the difference of its input and output voltage divided by RF. Then the overall input current is equal to:

$$i_{in} = \frac{Nv_{in} - \sum_{i=1}^{N} v_{out,i}}{R_f} = v_{in} \frac{N - \frac{\sum_{i=1}^{N} v_{out,i}}{v_{in}}}{R_f} \quad (14)$$

Defining the ratio of the total output voltage (i.e. sum of all slices) to the input voltage by $A_{QA}$, the input resistance can be written as:

$$R_{in} = \frac{v_{in}}{i_{in}} = \frac{R_f}{N + A_{QA}} = \frac{R_f}{100 + A_{QA}} \quad (15)$$

The feedback resistor $R_f$ can be made 3-bit adjustable to accommodate matching under different gain conditions, considering that $A_{QA}$ would change with the ladder offset (i.e., the overlap among the slices). Another condition on $R_f$ can be that it should be larger than the output resistance of the inverter, to not affect the gain. This condition can be automatically maintained when inverter size is increased to meet the NF requirement. The $R_f$ is AC-coupled to the input through $C_f$, which is sized to have lower impedance than $R_f$ at the operating frequency. Particularly, because in a QA system, each inverter can operate at a different bias point at a given time.

The LNA can also include a biasing RC network. The input is AC-coupled to the gate of the inverter with a capacitor generally much larger than the input capacitance to minimize attenuation and the effect of the gate capacitance non-linearity. The two ladder resistors can connect each slice to the previous and the next one, providing a continuous biasing and offsets $\Delta V$ (between 0 and 10 mV) among RF front-end units. This configuration provides low-pass filtering for the noise of resistors and makes it negligible at RF frequency. In this way, increasing resistor size can push the cut-off of the low-pass to a lower frequency and reduces the noise, meanwhile reducing the ladder power consumption as well. In some cases, care can be taken not to reduce the ladder current too much, as gate leakage of the inverters can move around the bias points and create non-linearity in the ladder.

A total noise figure of the LNA can be determined as:

$$NF_{LNA} = 1 + \underbrace{\frac{\gamma}{G_M R_S}}_{inverter} + \underbrace{\frac{(N + A_{QA})N}{A_{QA}^2}}_{matching} \quad (16)$$

where γ is the transistor noise factor and $G_M$ is the sum of all transconductances in the QA front-end. The NF portion due to the matching can be determined by referring the noises of N $R_f$ resistors to the input through gain $A_{QA}$, and assuming a matched condition $R_s=R_{in}$, using the $R_{in}$ expressed in Equation (15).

Passive down-conversion mixers following an LNTA can be used in radio front-ends for their good compression properties of the current mode architecture and linearity of passive switches. However, as higher order harmonic rejection (HR) is required, such architectures use multiple TIAs. Particularly, due to the required scaling of the signals in each phase being performed in the baseband; as scaling of the current coming from the LNTA in each phase is generally not possible.

Figure 9:
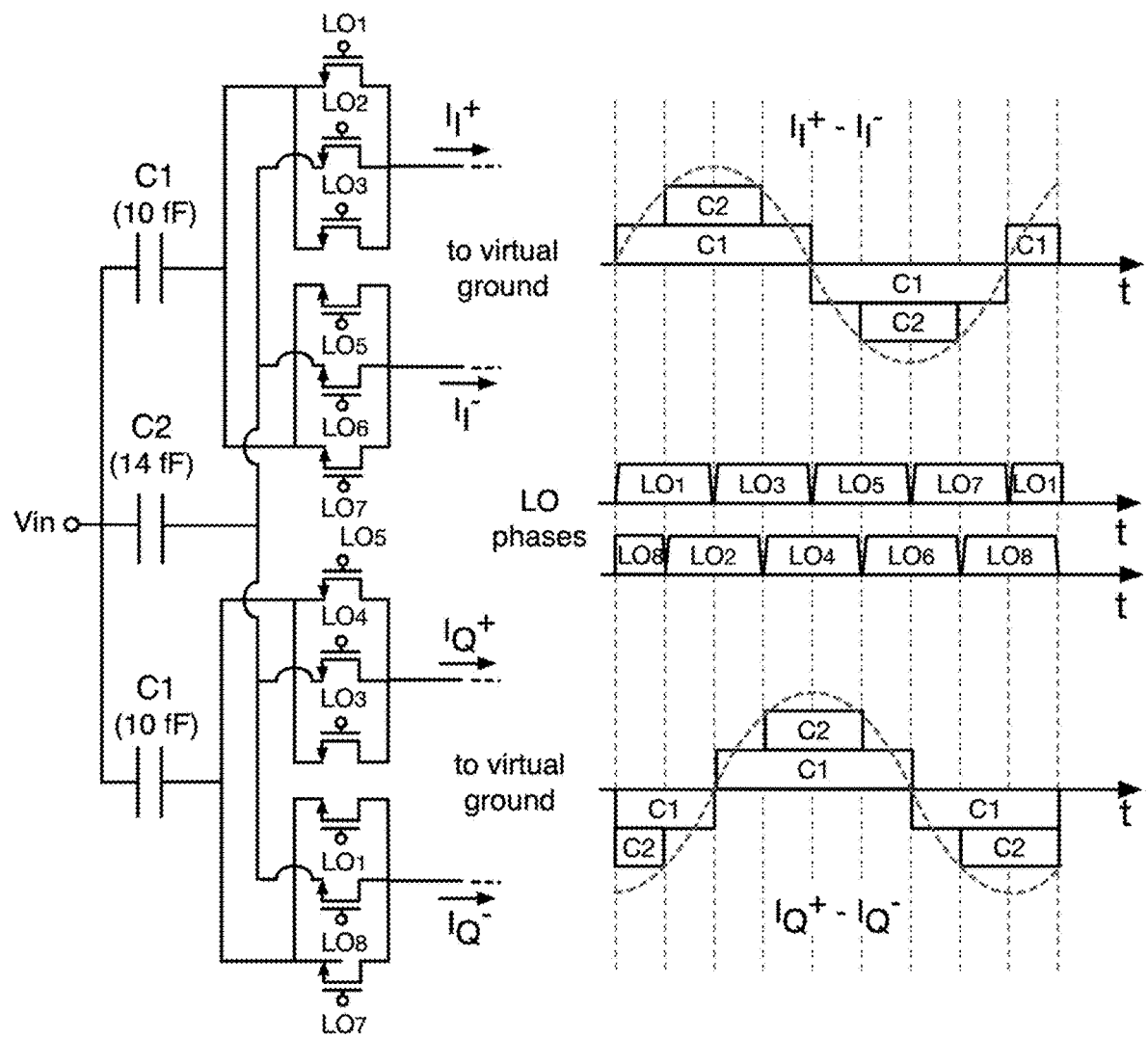
FIG. 9 is a schematic of a passive harmonic rejection (HR) mixer in accordance with the system of FIG. 1.

In the present embodiments, a passive HR mixer, as exemplified in the schematic of FIG. 9, can be used following a voltage mode LNA as exemplified in FIG. 8. The present voltage-mode architecture can allow scaling of the signals by terminating the LNA with a different impedance in each phase. This allows for a different current flowing into the mixer in each phase, therefore only a single baseband can be sufficient to recombine the down-converted currents. FIG. 9 shows an example of the mixer architecture with C1 and C2 being impedances that convert the output voltage of the LNA to current signals, which are directed to one of the low impedance baseband terminals (I+, I−, Q+, or Q−) in each LO phase. In this way, the amount of current flowing to the baseband can be varied from phase to phase and an effective LO signal free of 3rd and 5th harmonics can be generated. In general, a sinusoidal signal uniformly sampled at any 8 points would not have 3rd and 5th harmonics. In addition, a specific choice of these sampling points can minimize the number of required levels, allowing the use of a smaller number of impedances following the LNA. FIG. 9 also shows an example of a sampling scheme in accordance with the present embodiments. The sampling scheme may need only 2 distinct amplitude levels, hence only two distinct capacitance values C1 and C2, where C2 is 1.41 times larger than C1. In this example, capacitors were used instead of resistors is to avoid thermal noise. Notice that the three capacitors act as a load for the LNA, and their impedance is generally larger than the LNA output impedance to allow the LNA to work in voltage-mode.

The mixer transconductance with the given down-conversion scheme can be calculated as:

$$G_{mix} = \frac{4}{\pi} \cdot \omega C1 \qquad (17)$$

In some cases, all of the QA outputs can be shorted at the baseband low impedance terminals, therefore the overall RF gain is equal to $A_{QA} \cdot G_{mix}$.

In an example, the harmonic rejection scheme of the present embodiments can require 8 LO phases with 45° phase shift and a 25% duty-cycle; as illustrated in FIG. 9. In an example, these waveforms can be generated with a divide-by-four frequency divider composed of 4 flip-flops (8 master-slave dynamic latches). Initially the flip-flops' bits are reset to the binary value of '1000', which is then circulated through the shift register. This makes the latch outputs circulate the binary value of '11000000', resulting in 25% duty cycle waveforms shifted by 45° as intended.

In some cases, having a local frequency divider in each QA RF front-end slice allows simpler phase distribution. Instead of distributing eight 2 GHz LO phases across 600 um i.e. 100 slices with 6 um pitch), a single 8 GHz clock can be routed and the waveforms can be generated locally. The size and power consumption of the divider can be defined based on the phase noise requirement, which can be determined from the blocker noise figure contribution (BNF) due to the reciprocal mixing in Equation (4); as determined as:

$$BNF = P_b + L(\Delta f) + 174_{[dBm/Hz]} \qquad (18)$$

where $P_b$ is the blocker power, which can be assumed to be 0 dBm based on example design specifications.

Figure 10:
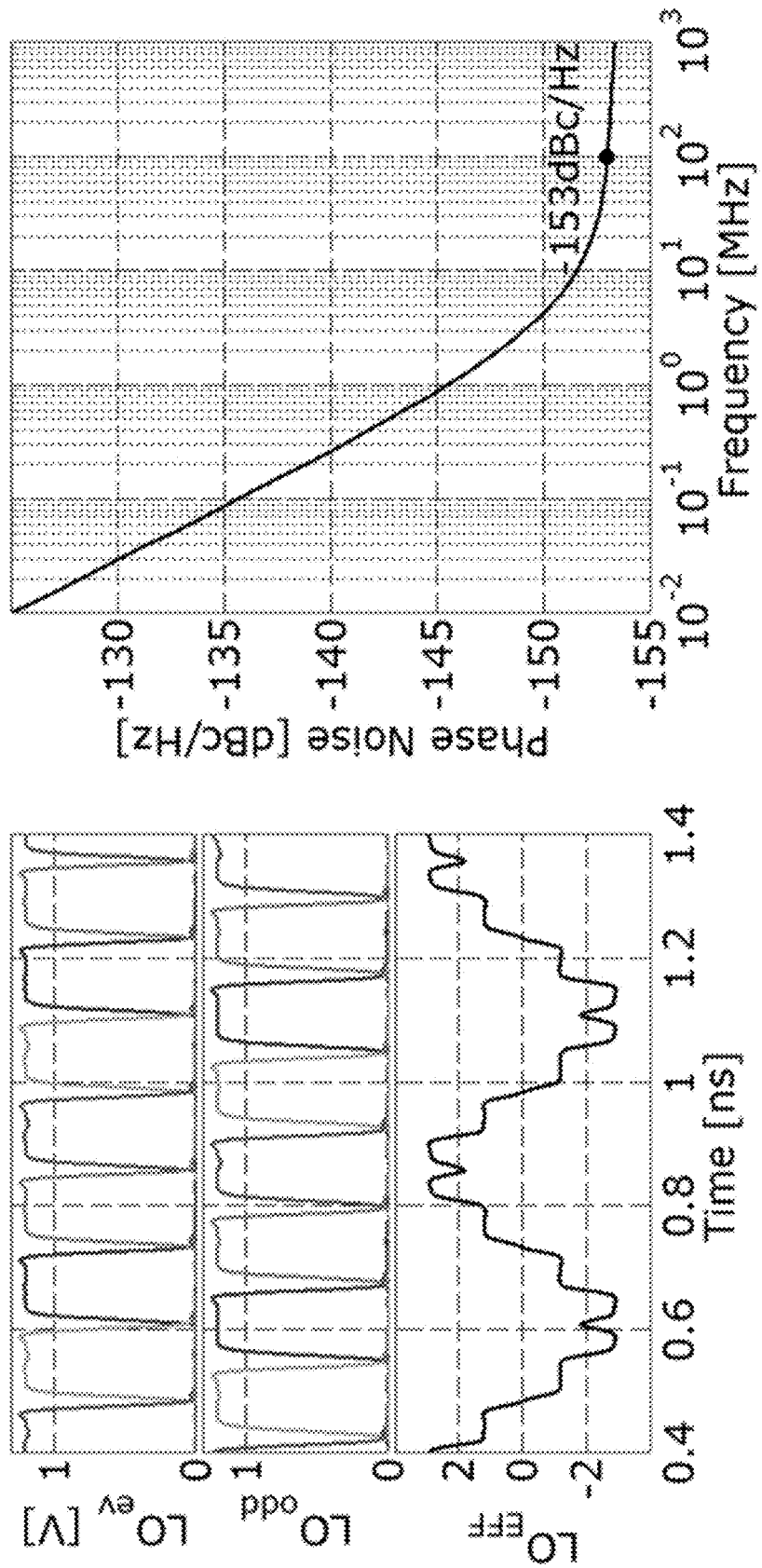
FIG. 10 shows charts of an example experiment for a post-layout simulated phase noise of the effective local oscillator (LO) waveform of the divider in a single slice of the QA front-end.

In an example, considering that the LNA NF would be around 7 dB in the high linearity mode (i.e., with the largest offset in ladder) and targeting an overall NF less than 10 dB, the BNF can be as large as 7 dB. This suggests that phase noise at the offset of the blocker (100 MHz in this example) can be less than −167 dBc/Hz. FIG. 10 shows an example experiment for a post-layout simulated phase noise of the effective LO waveform of the divider in a single slice of the QA RF front-end, which was driven by an 8 GHz clock signal (for the LO frequency of 2 GHz). The phase noise at 100 MHz offset is −153 dBc/Hz suggesting that for the total of 100 slices it is −173 dBc/Hz, which is 6 dB better than the requirement. In this example, the divider consumes 27.6 mW from a 1.2V supply in this case.

Figure 11:
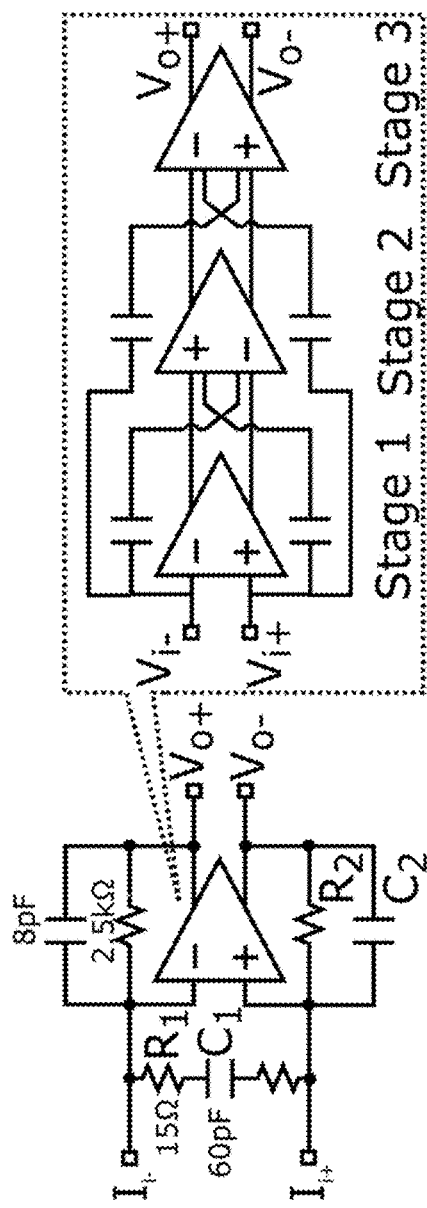
FIG. 11 is a schematic for an example op amp having a three-stage feed-forward topology in accordance with the system of FIG. 1.

In the above example, the feedback $R_2$—$C_2$ network places the cut-off frequency of the TIA at 8 MHz, and a larger input capacitance $C_1$ is used to provide a low impedance node, at frequencies beyond opamps unity gain frequency. A small resistor $R_1$ is placed in series with C1 for stability purposes. In an example, the opamp can have a three-stage feed-forward topology as shown in FIG. 11, for achieving large gain, bandwidth, and the output swing. The first stage has a high gain, low bandwidth, the second stage has a moderate gain, and moderate bandwidth, and the third stage has a low gain and a high bandwidth. The input can be AC-coupled to every stage, so that when the gain of a former stage drops, the gain of the latter stage takes over, recovering the phase drop. In this way even at high frequencies, when the first two stages have very low gain, but the last stage still is functional, the opamp can behave similar to a first order system, hence maintaining stability. In this example, to achieve the gain-bandwidth requirement, the first stage can be designed with 800 nm length devices, the second stage with 120 nm length devices, and the last stage with 60 nm length devices. In this example, the three stages consume 1.6 mA, 0.3 mA, and 0.8 mA, respectively, while biasing and common mode feedback circuitry consume 0.3 mA overall. This makes the total power consumption of the two opamps (I and Q) 6 mW (operated from 1V supply) in idle condition and 8.5 mW in presence of a large blocker (when the third stage sinks or sources additional blocker current).

Figure 12:
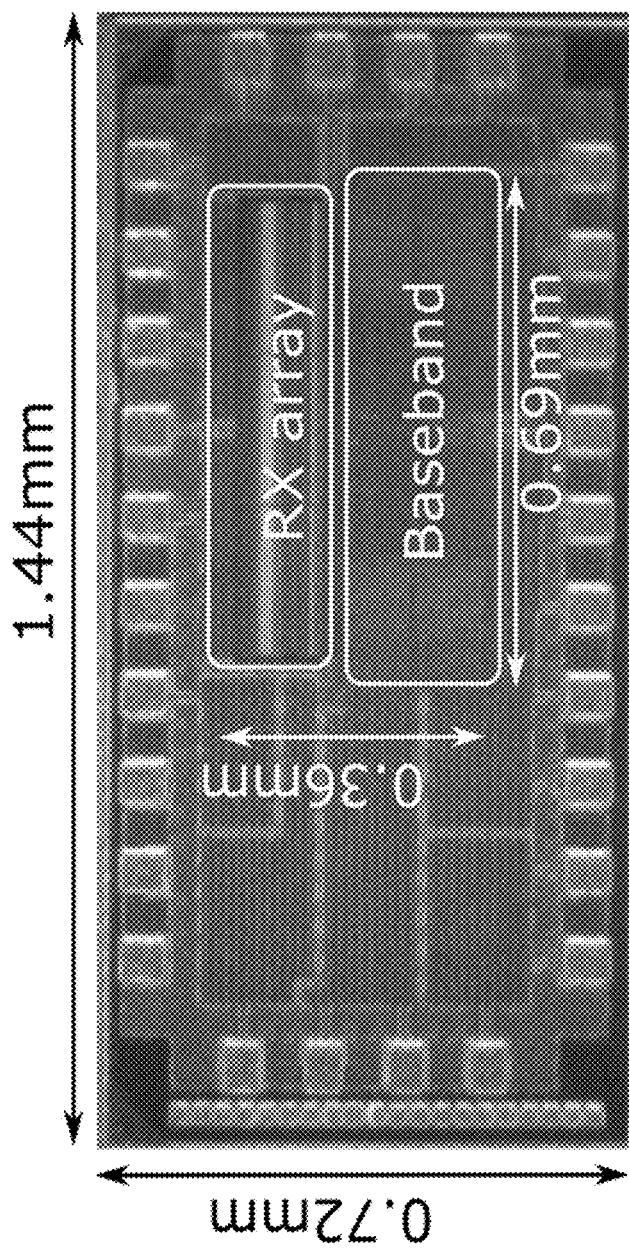
FIG. 12 is a micrograph of a prototype for example experiments.

The present inventors conducted example experiments with an example prototype to validate the advantages of the present embodiments. The prototype was fabricated in 65 nm CMOS technology and occupied an active area of 0.25 mm². The micrograph for the prototype is shown in FIG. 12. The width of a single RF unit was 6 μm, therefore the overall front-end was 600 μm wide. The baseband layout was implemented with a particular consideration given to matching the total width of the RF front-end. The chip was wire-bonded to a daughterboard which had two SMA connectors for the LO clock and RF input. Both connections were impedance controlled and had a it-matching network to compensate for the parasitics.

FIG. 13 shows measured RF gain of the front-end at different offsets between the RF units for the example experiments. The gain has been measured between 0.7 GHz and 1.4 GHz. The lower bound of frequency is defined by the high-pass nature of the ladder, while the upper bound is limited by the divider operation explained above. Upon the DC-offset between the slices the gain of the front end can be reconfigured between 20 dB and 36 dB. The baseband filtering profile is also shown. The 3-dB cut-off frequency is 10 MHz, and 30 dB attenuation is obtained at 100 MHz. Therefore, blockers are placed at this offset in the compression and linearity measurements.

Figure 14:
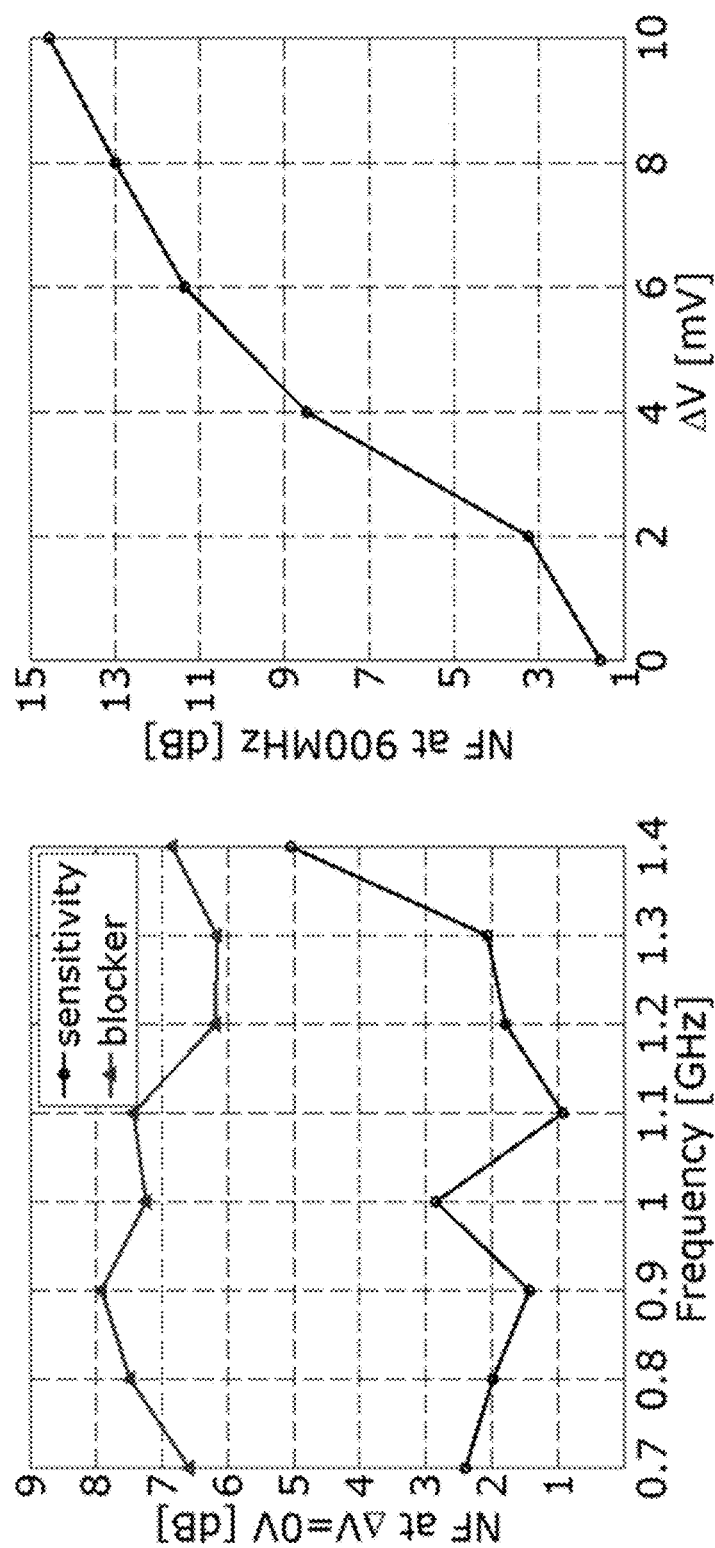
FIG. 14 shows noise figure (NF) measurements for the example experiments across the operating frequencies.
Figure 15:
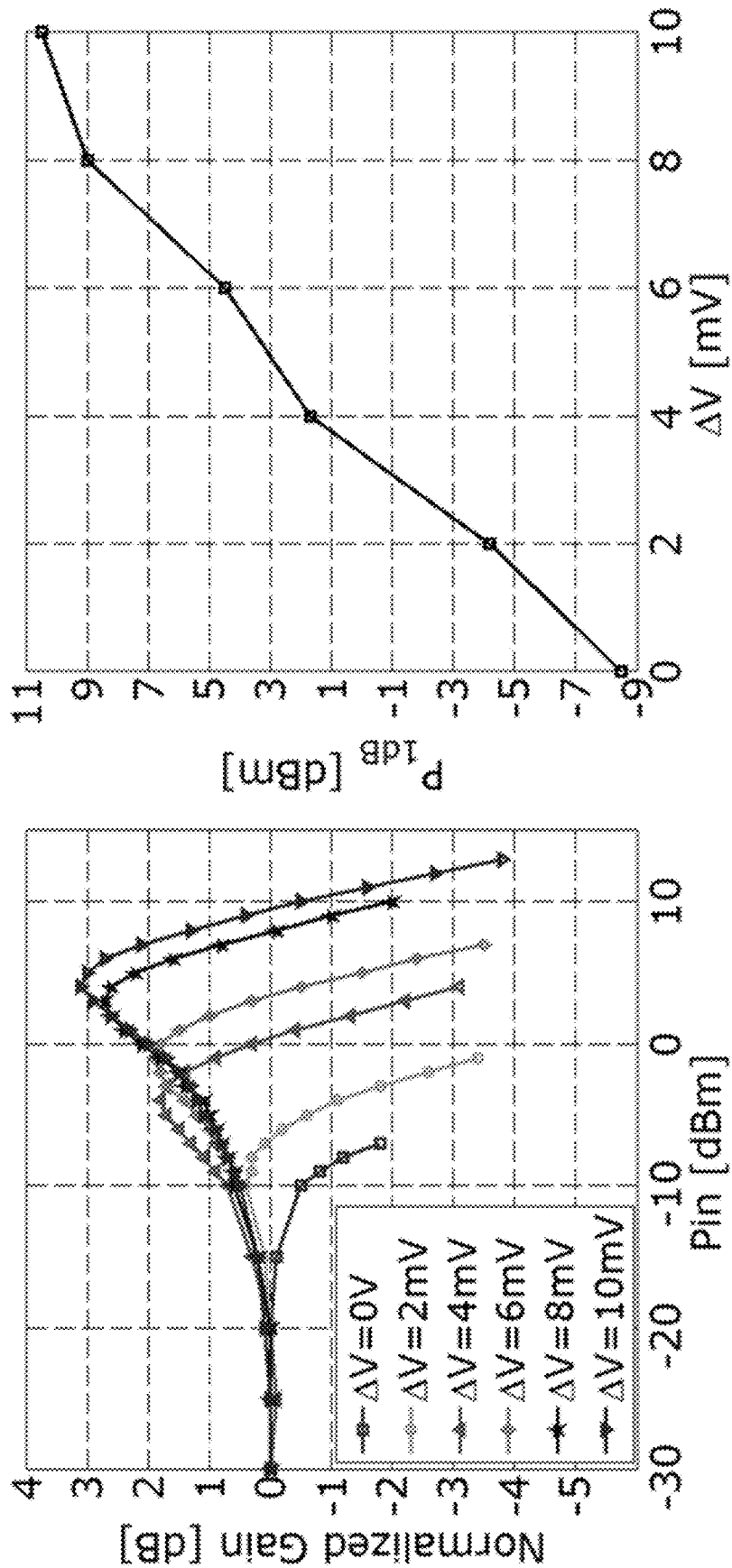
FIG. 15 shows $P_{1dB}$ for the example experiments as a function of offset.

FIG. 14 shows NF measurements for the example experiments across the operating frequencies, for the low-noise configuration (i.e. $\Delta V=0V$) both in sensitivity and with a blocker at 100 MHz offset resulting in 1-dB compression ($P_{1\ dB}$). The NF remains within 1.0 dB to 2.8 dB until 1.3 GHz and starts increasing at 1.4 GHz because of the issues with the divider. The average NF from 0.7 GHz to 1.3 GHz is 1.9 dB. In the presence of $P_{1\ dB}$ blocker, the maximum NF increases to 7.9 dB. FIG. 14 also shows the increase in the NF for increasing 0V. The NF increases by 13 dB from $\Delta V=0V$ (i.e. $V_{ladder}=0$) to $\Delta V=10$ mV (i.e. $V_{ladder}$ 0.5V). FIG. 15 shows the $P_{1\ dB}$ for the example experiments as a function of offset, extracted from input-output power curves. FIG. 15 shows different offset configurations, extracted from the normalized gain curves, when the LO frequency is 900 MHz and the blocker is placed at a 100 MHz offset. The compression point increases from −8.5 dBm to 10.5 dBm (by 19 dB) as 0V is varied from 0V to 10 mV. Notice that with increasing 0V, the $P_{1\ dB}$ increases faster than the NF, therefore the DR also increases. At the maximum offset of $\Delta V=10$ mV, the benefit in the DR becomes 6 dB, considering that the NF increases by only 13 dB while $P_{1\ dB}$ improves by 19 dB. This illustrates a substantial advantage of the present embodiments in the QA example. For example, the 6 dB improvement is equivalent to a 4-times power saving.

FIG. 16 shows power consumption of the signal path (LNA and Baseband) for different offsets, and the clock path (divider) across RF frequencies. In FIG. 16, the current consumption for the LNA and baseband at different offsets in the ladder are shown. In each case currents were measured for two configurations; with no blocker (i.e. sensitivity) and in presence of $P_{1\ dB}$ blocker. LNA operating from a 0.8V supply consumed a maximum power of 7.4 mW in sensitivity for zero offset ($\Delta V=0V$), which drops to about 2 mW for the largest offset ($\Delta V=10$ mV) as expected. In the presence of the $P_{1\ dB}$ blocker at larger offsets, the dynamic power burnt in the mixer capacitances increased the LNA consumption to a maximum of 5.8 mW. The baseband power did not depend on the offset, because it only depended on the current entering the TIAs. In the absence of blockers, the current signal down converted and injected into the TIA was very small, hence the baseband operating from a 1V supply consumed 6.6 mW. In the presence of $P_{1\ dB}$ blockers, the current injected into the TIA increased and so the power rose to 8 mW. The overall signal path consumed 14 mW in sensitivity and 13.8 mW in presence of the largest blocker. Divider current is also shown in FIG. 16 across RF frequencies. It increased linearly as expected with 37.2 mW/GHz slope (2.7-times larger than predicted by the post-layout simulations as explained before) and dropping after 1.4 GHz due to the dysfunctional divider.

Figure 17:
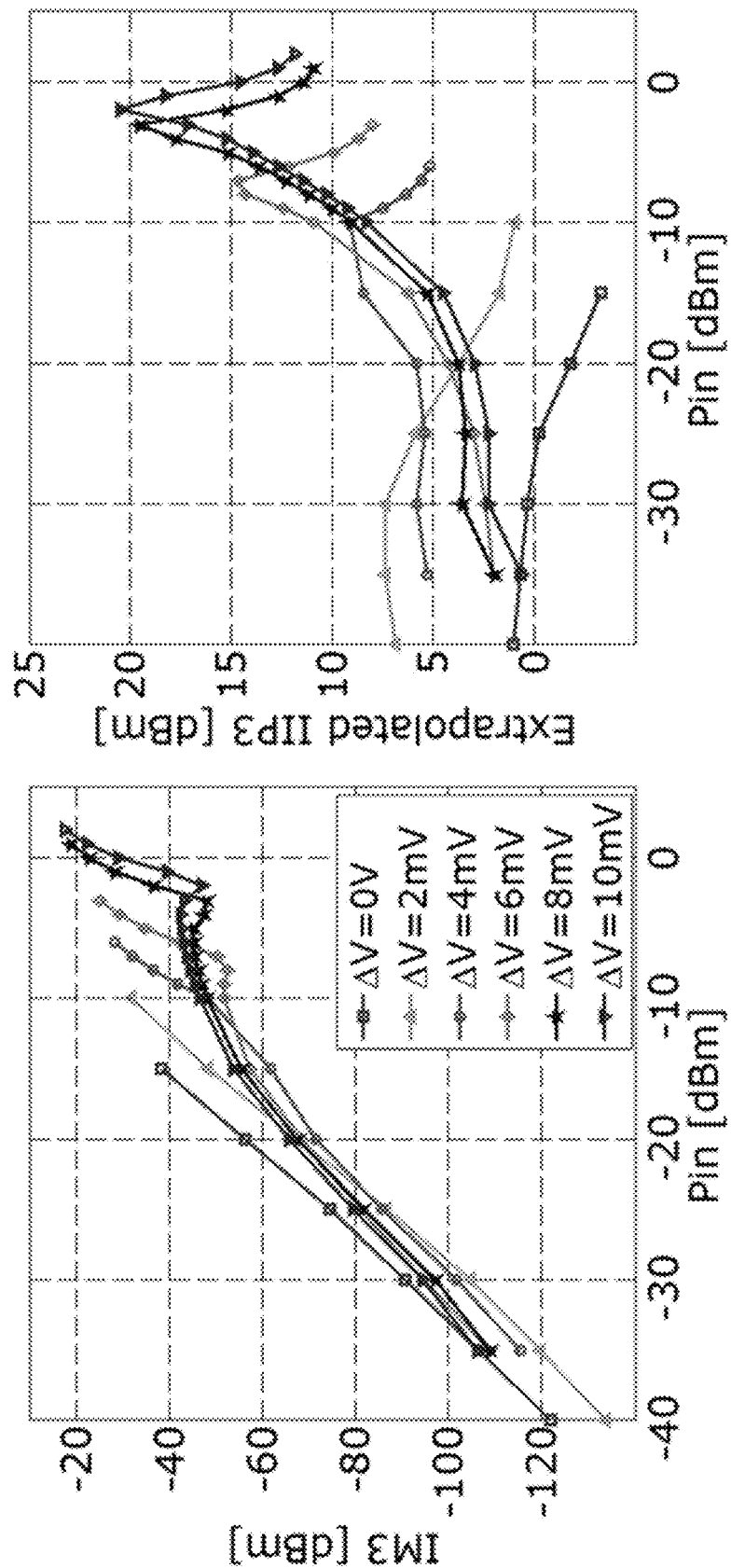
FIG. 17 shows IM3 and IIP3 curves for the example experiments obtained from two-tone test.
Figure 18:
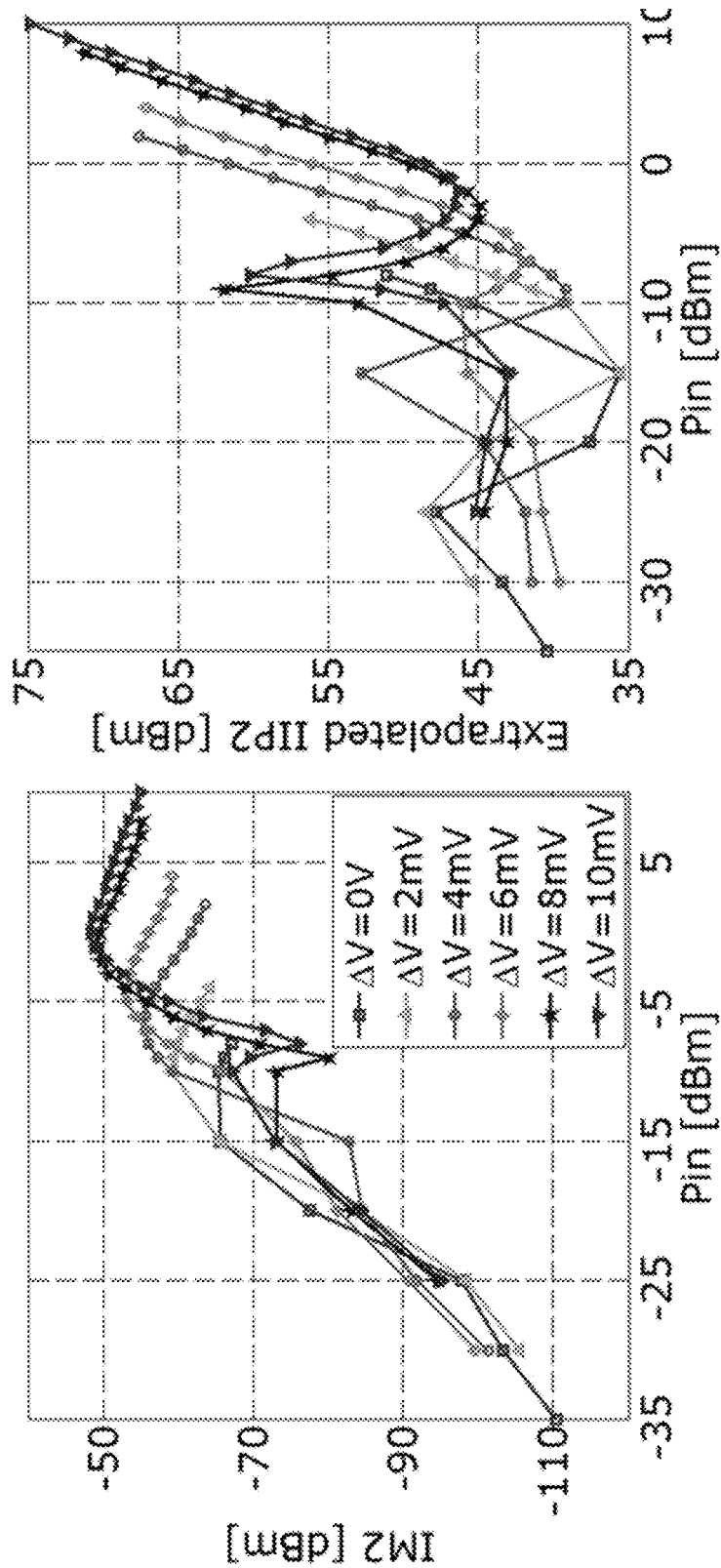
FIG. 18 shows IIP2 and IM2 plots obtained from a two-tone test for the example experiments.

In some cases, linearity of a QA system cannot readily be characterized by measures like IIP2 and IIP3 because, due to the averaging of transfer characteristics, the distortion is spread across multiple high order terms rather than being accumulated around only the lower order terms. However, just for illustration and for the sake of providing a comparison with other approaches, IIP2 and IIP3 measurements were performed by sweeping the input power. FIG. 17 shows the IM3 and IIP3 curves for the example experiments obtained from two-tone test, where blockers are placed at 702 MHz and 800 MHz, creating an intermodulation product at 898 MHz, which down-converts to 2 MHz IF frequency with the 900 MHz LO. As illustrated, even for small signal powers $\Delta V=2$ mV, the present embodiments provide 6 dB better IIP3 than $\Delta V=0V$. This is due to the averaging of the transfer characteristics with QA architecture compared to a single inverter. Increasing $\Delta V$ further reduces small signal IIP3 because of the gain ripple in transfer characteristics. However, as signal amplitude increases, ripples do not matter as much, and IIP3 further improves. The power of peak IIP3 increases with increasing offset voltages. As power increases further, compression causes IIP3 to drop again. The overall IIP3 variation is from 1 dBm to 20.5 dBm. A similar behavior can be observed for IIP2 and IM2 plots shown in FIG. 18, obtained from a two-tone test for the example experiments where blockers are placed at 1000 MHz and 1002 MHz, creating a leakage intermodulation product at 2 MHz. Increasing $\Delta V$ improves IIP2 at higher signal powers. The overall IIP2 variation is from 35 dBm to 75 dBm.

Figure 19:
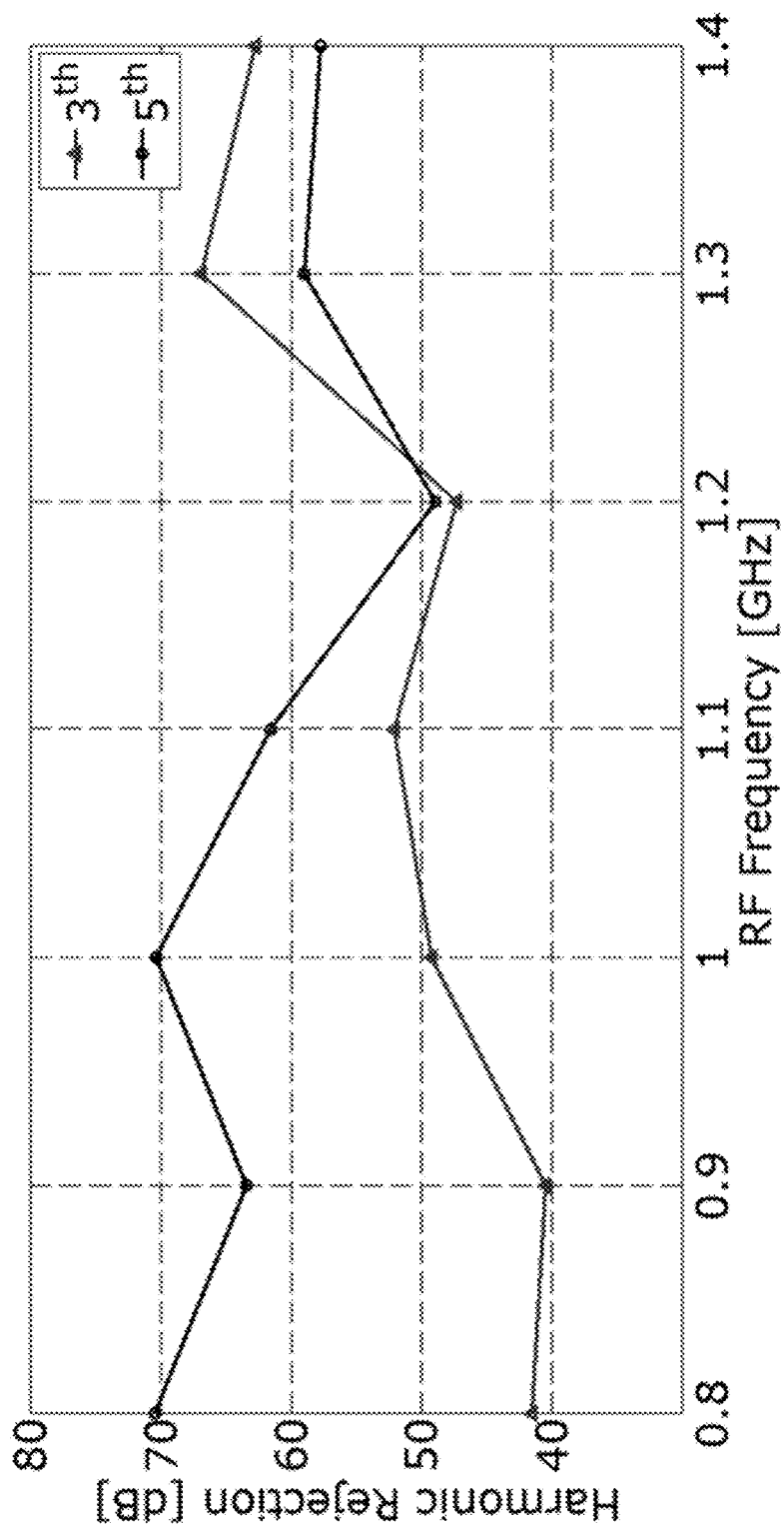
FIG. 19 shows the 3rd order and 5th order harmonic rejection across operating frequencies for the example experiments.

Harmonic rejection of the present embodiments was measured with $\Delta V=4$ mV and with the IF bandwidth of 2 MHz. FIG. 19 shows the 3rd order and 5th order harmonic rejection across operating frequencies for the example experiments; measured by applying signals to the input at frequencies 3-times and 5-times larger than LO frequency (plus 2 MHz IF bandwidth). In this case, 40-68 dB rejection is obtained for the 3rd harmonic and 50-70 dB rejection for the 5th harmonic.

TABLE 1 provides comparisons of the prototype receiver in the example experiments with other approaches. The prototype was compared to a mixer-first receiver with an auxiliary noise-canceling path and harmonic rejection, to a receiver with a transformer based LNTA for achieving swings larger than supply, and to a receiver with a voltage mode LNA with an impedance up-conversion to help with LNA output compression.

TABLE 1

| Topology | Present Embodiments | Noise Canceling | Transform.-LNTA | Voltage-mode |
|---|---|---|---|---|
| Area [mm2] | 0.25 | 5 | 0.84, 0.74a | 0.6 |
| Freq. (GHz) | 0.7-1.4 | 0.6-3 | 1.8, 2.4a | 0.4-3 |
| Gain [dB] | 20.8b, 36.8c | NA | 44.5, 45.5a | 70 |
| NF [dB] | 1.9c-14.6b | 1.8b-3b | 3.8, 1.9a | 1.8-3.1 |
| NFblk [dB] | 6.6c-7.9c | 7-9 | 7.9 | 14, 10d |
| IIP3 [dBm] | 1b-20.5b | 10a-11.5a | 18,16a | 3,8d |
| IIP2 [dBm] | 35b-75b | 49.5a-55a | 64,66a | 55,80e |
| P1dB [dBm] | −8.5c, 10.5b | −6, −1 | −1.5 | −13 |
| HR(3rd/5th) [dB] | 40-68/50-70 | 52/54 | 54/65 | 40/50, 70/75e |
| Supply [V] | 0.8, 1, 1.2 | 1 | 1.2, 1.8 | 0.9 |
| PLO [mW] | 37.2/GHz | 13/GHz | 3.2/GHz | 6.8/GHz + 5.4 |
| PLNA+BB [mW] | 13.7b, 14c | 30-46 | 23.4 | 14.3 |
| Technology | 65 nm | 28 nm | 40 nm | 28 nm |

As validated in the example experiments, the present embodiments provide a substantially improved RF receiver with a quantized analog front-end having a reconfigurable DR and a harmonic rejection architecture. System reconfigurability allows having NF as low as 1.9 dB and compression point as high as 10.5 dB, while consuming only 14 mW in the signal path. Such high compression point is made possible with the QA architecture, despite using voltage mode LNAs. Voltage-mode operation also facilitates 3rd and 5th order harmonic rejection in the mixer which is followed by only two baseband TIAs.

To illustrate the effect of the random mismatches on the linearity of the Quantized Analog Front-End (QAFE), the present inventors performed two different set of example simulations: one to evaluate the impact on the Total Harmonic Distortion (THD) generated by a large signal, and one to evaluate the impact of a large interferer on a small wanted signal (i.e. desensitization test). Such simulations were performed at three different offsets $\Delta V$, $\Delta V=0V$ (no offset), $\Delta V=4$ mV (moderate offset), $\Delta V=10$ mV (largest offset). Each example simulation was performed twice, once in nominal condition and once by using the mismatch models for transistors, mim-caps and resistors. The mismatch simulations were performed at only one seed. The example simulations were able to demonstrate the effect of gain and offset mismatches among the QAFE elements on the overall transfer characteristics.

In the example simulations, to evaluate the impact of mismatches on the THD, the entire 100-element QAFE was simulated with the input power swept from −40 dBm to 10 dBm, and the THD was calculated over 100 harmonics.

Figure 20:
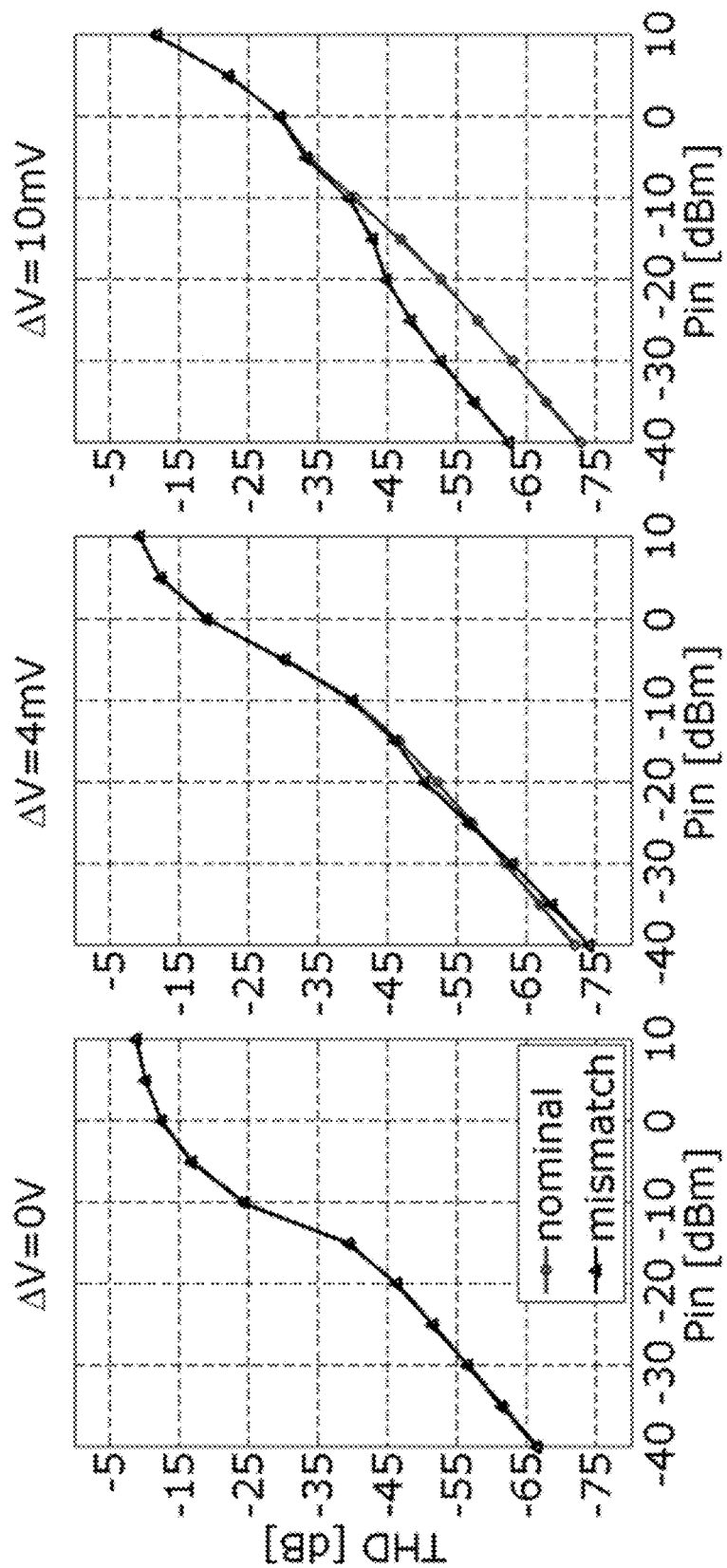
FIG. 20 shows results of example simulations of the effect of mismatches on total harmonic distortion (THD) as a function of input power for different offsets.

FIG. 20 shows the simulation results by showing the effect of mismatches on THD as a function of input power for different offsets among the QAFE elements. At no offset (i.e. $\Delta V=0V$), the THD performance was identical in both cases (i.e. nominal and mismatch) because all slices operated in parallel at a single bias point. For $\Delta V=4$ mV, at low input powers the overall THD improved compared to $\Delta V=0V$ and the impact of mismatches appeared negligible (less than 1 dB variation). This behaviour can be explained by considering that at $\Delta V=4$ mV there is a considerable overlap among the characteristics that not only averages non-linearities but also the impact of mismatches. In fact, since the inverter's input range was around 80 mV, with $\Delta V=4$ mV, there were 20 unsaturated slices overlapped.

In the example simulations, for $\Delta V=10$ mV and low input powers (lower than −10 dBm) there was a considerable difference in THD (around 10 dB) between nominal and mismatched cases. This effect can be attributed to the fact that the number of overlapped elements was smaller compared to the previous case (e.g. 8 inverters, if the input range is 80 mV as considered before). The mismatches substantially nullified the averaging of small signal non-linearities and the THD tends to the case with no overlap. On the other end, at larger input powers, the impact of mismatches diminished again, this time because larger signal explores more slices by shuffling multiple gain characteristics and so by averaging out the differences. Despite the discrepancies at low powers, the compression point for $\Delta V=10$ mV was 10.5 dBm. This implies that if this mode is used, the signal power is probably already above −10 dBm, and hence effect of the mismatches is negligible. Consequently, if the system is adapted to the input-signal power, mismatches should not impose a significant problem.

Figure 21:
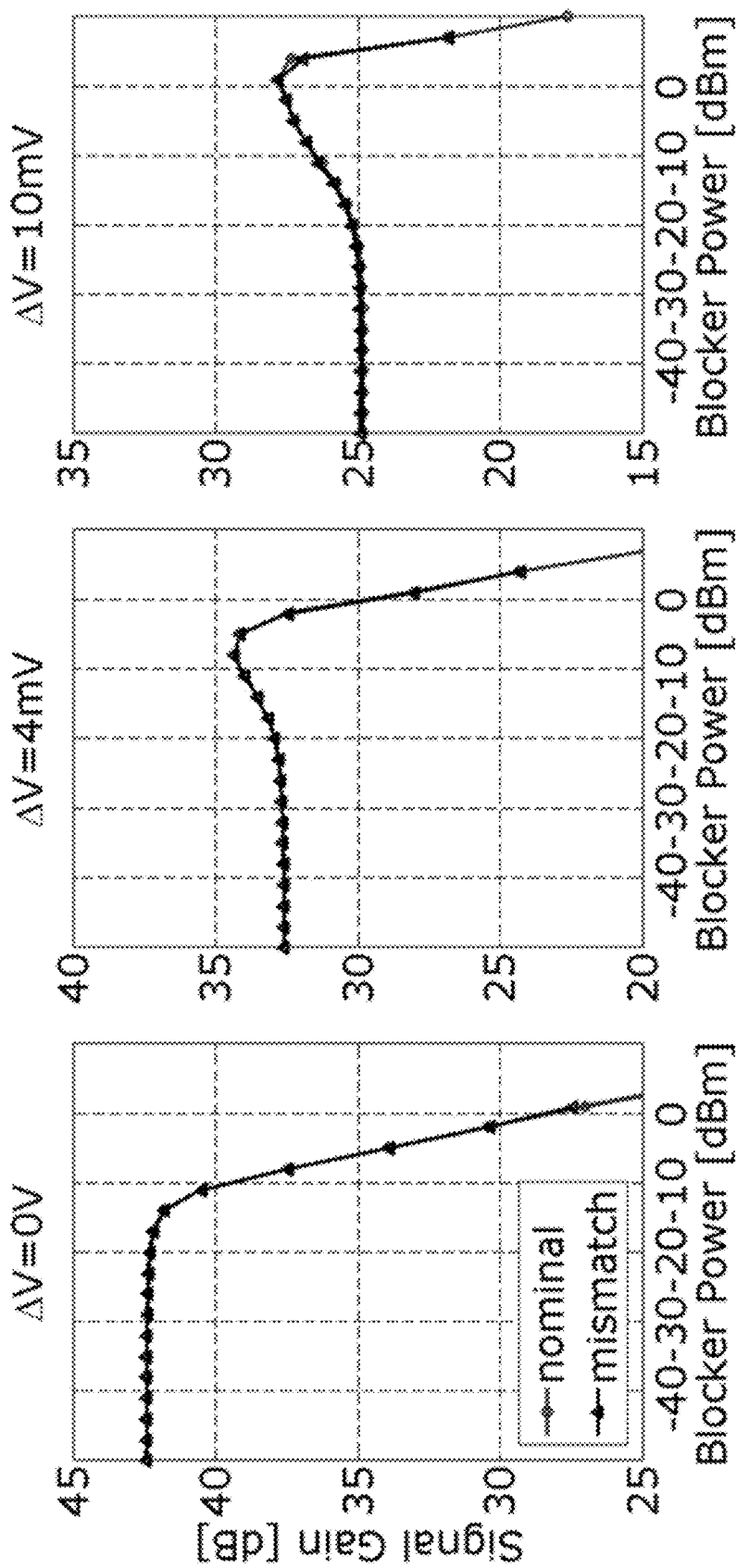
FIG. 21 shows the small signal gain as a function of blocker input power for the example simulations.

In the example simulations, the impact of a large interferer on a small wanted signal was characterized through a desensitization test. Generally, in an amplifier, the presence of a large signal along with a small wanted signal leads to a sort of "swing" of the operating point by affecting the small-signal gain (eventually by reducing it). In the case of the QAFE of the present embodiments, the presence of large blockers had a similar effect, because the instantaneous value of the voltage signal at the input defined which amplifiers were active at a given time. In this case, the presence of mismatches can affect the overall signal gain. To characterize this effect, a desensitization simulation test was performed with and without mismatches among the lines. FIG. 21 shows the small signal gain as a function of blocker input power (for $\Delta V=0V$, $\Delta V=4$ mV, and $\Delta V=10$ mV). The small signal at −60 dBm signal at 1.8 GHz was applied to the input along with the blocker at 2 GHz, its power being swept from −50 dBm to 10 dBm. In this case, mismatches did not have a significant impact on the small signal gain even at large offsets. This is because even in the case of the largest $\Delta V=10$ mV, there was still an overlap of 8 units and mismatches among the lines were averaged by exploring several lines.

Although the invention has been described with reference to certain specific embodiments, various modifications thereof will be apparent to those skilled in the art without departing from the spirit and scope of the invention as outlined in the claims appended hereto. The entire disclosures of all references recited above are incorporated herein by reference.

The invention claimed is:

1. A system for linear signal processing with signal decomposition, the system comprising:
   a decomposition module configured to receive an analog input signal and perform the signal decomposition, the signal decomposition comprising voltage, nonlinear, and time invariant slicing of the analog input signal into a plurality of slices to produce one or more analog components and one or more digital components, the decomposition module directing each of the plurality of slices to one of a plurality of signal paths; and
   a processing module configured to perform one or more linear operations on at least one of the plurality of signal paths.

2. The system of claim 1, wherein the signal decomposition comprises slicing the analog input signal into the plurality of slices by an amplitude of the analog input signal.

3. The system of claim 2, wherein the analog components comprise unsaturated slices of the analog input signal and the digital components comprise saturated slices of the analog input signal, the unsaturated slices and the saturated slices determined by a value of the analog input signal.

4. The system of claim 3, wherein adjacent unsaturated slices overlap with each other.

5. The system of claim 3, wherein the digital components are either saturated to a minimum analog value corresponding to a digital value of 0 or are saturated to a maximum analog value corresponding to a digital value of 1, and wherein the analog components can take a value between the minimum analog value and the maximum analog value.

6. The system of claim 1, further comprising an output module configured to output the signal of one or more of the plurality of signal paths.

7. The system of claim 1, further comprising a combination module configured to combine the signal of two or more of the plurality of signal paths, and an output module configured to output the combined signal.

8. The system of claim 7, wherein combining the plurality of signal paths comprises summing the plurality of signal paths.

9. The system of claim 8, wherein the decomposition module performs the signal decomposition by applying a dc offset on each of the plurality of signal paths, and the one or more linear operations performed by the processing module comprise amplification after each of the dc offsets.

10. The system of claim 1, wherein the one or more linear operations each comprise one of amplification, mixing, filtering, convolution, frequency translation, and optical driving.

11. A method for linear signal processing with signal decomposition, the method comprising:
receiving an analog input signal;
performing the signal decomposition by slicing the analog input signal into a plurality of voltage, nonlinear, and time invariant slices to produce one or more analog components and one or more digital components;
directing each component to one of a plurality of signal paths; and
performing one or more linear operations on the plurality of signal paths.

12. The method of claim 11, wherein the signal decomposition comprises slicing the analog input signal into the plurality of slices by an amplitude of the analog input signal.

13. The method of claim 11, wherein the analog components comprise unsaturated slices of the analog input signal and the digital components comprise saturated slices of the analog input signal.

14. The method of claim 13, wherein adjacent unsaturated slices overlap with each other.

15. The method of claim 13, wherein the digital components are either saturated to a minimum analog value corresponding to a digital value of 0 or saturated to a maximum analog value corresponding to a digital value of 1, and wherein the analog components can take a value between the minimum analog value and the maximum analog value.

16. The method of claim 11, further comprising outputting a signal of one of the plurality of signal paths.

17. The method of claim 11, further comprising combining the plurality of signal paths, and outputting a combined signal of the plurality of signal paths.

18. The method of claim 17, wherein combining the plurality of signal paths comprises summing the plurality of signal paths.

19. The method of claim 11, wherein the one or more linear operations each comprise one of amplification, mixing, filtering, convolution, frequency translation, and optical driving.

20. The method of claim 11, wherein performing the signal decomposition comprises applying a dc offset on each of the plurality of signal paths, and performing the one or more linear operations comprises performing amplification after each of the dc offsets.

* * * * *